United States Patent
Kim et al.

(10) Patent No.: US 12,349,331 B2
(45) Date of Patent: Jul. 1, 2025

(54) SEMICONDUCTOR DEVICE AND METHOD FOR FABRICATING THE SAME

(71) Applicant: SK hynix Inc., Gyeonggi-do (KR)

(72) Inventors: Seung Hwan Kim, Gyeonggi-do (KR); Kyung Hoon Min, Gyeonggi-do (KR); Ilsup Jin, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 376 days.

(21) Appl. No.: 17/711,777

(22) Filed: Apr. 1, 2022

(65) Prior Publication Data
US 2023/0115443 A1    Apr. 13, 2023

(30) Foreign Application Priority Data
Oct. 7, 2021 (KR) .................. 10-2021-0133191

(51) Int. Cl.
*H10B 12/00* (2023.01)
(52) U.S. Cl.
CPC ............. *H10B 12/05* (2023.02); *H10B 12/02* (2023.02); *H10B 12/30* (2023.02)

(58) Field of Classification Search
CPC ...... H10B 12/02; H10B 12/03; H10B 12/036; H10B 12/0387; H10B 12/05; H10B 12/30; H10B 12/488
See application file for complete search history.

(56) References Cited

U.S. PATENT DOCUMENTS

2020/0168622 A1    5/2020  Fukuzumi et al.
2021/0175173 A1*   6/2021  Shin .................... H01L 23/5226

OTHER PUBLICATIONS

Office Action for Korean Patent Application No. 10-2021-0133191 issued by the Korean Patent Office on May 22, 2025.

* cited by examiner

*Primary Examiner* — Michelle Mandala
*Assistant Examiner* — Kevin Quinto
(74) *Attorney, Agent, or Firm* — IP & T GROUP LLP

(57) ABSTRACT

A method for fabricating a semiconductor device includes: forming an etch stopper pad including a sacrificial plug over a substrate and a sacrificial pad over the sacrificial plug; forming an etch target layer over the etch stopper pad; forming a plurality of openings by etching the etch target layer and stopping the etching at the sacrificial pad; forming an air gap by removing the sacrificial pad and the sacrificial plug through the openings; and forming a gap-fill layer that fills the openings and the air gap.

20 Claims, 29 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No. 10-2021-0133191, filed on Oct. 7, 2021, which is incorporated herein by reference in its entirety.

BACKGROUND

1. Field

Embodiments of the present invention relate to a semiconductor device, and more particularly, to a semiconductor device including three-dimensional memory cells and a method for fabricating the semiconductor device.

2. Description of the Related Art

Since the degree of integration of a two-dimensional (2D) semiconductor memory device mainly depends on the area occupied by the memory cells, it is greatly affected by the level of fine pattern forming technology. Hence, although the degree of integration of the 2D semiconductor memory devices continues to increase, it is nevertheless limited because of the technology and cost of the equipment for forming fine patterns. Another solution that overcomes the limitations of 2D semiconductor devices, involves the development of three-dimensional (3D) semiconductor memory devices which arrange the memory cells in a 3D structure.

SUMMARY

Embodiments of the present invention are directed to a 3D semiconductor device including highly integrated memory cells, and a method for fabricating the semiconductor device.

In accordance with an embodiment of the present invention, a method for fabricating a 3D semiconductor device includes: forming an etch stopper pad including a sacrificial plug over a substrate and a sacrificial pad over the sacrificial plug; forming an etch target layer over the etch stopper pad; forming a plurality of openings by etching the etch target layer and stopping the etching at the sacrificial pad; forming an air gap by removing the sacrificial pad and the sacrificial plug through the openings; and forming a gap-fill layer that fills the openings and the air gap.

In accordance with another embodiment of the present invention, a semiconductor device includes: a metal pad over a substrate; a first lateral insulating pad over the metal pad; a second lateral insulating pad positioned at a higher level than the first lateral insulating pad; and a memory cell array positioned at a higher level than the second lateral insulating pad.

DETAILED DESCRIPTION

Figure 1:
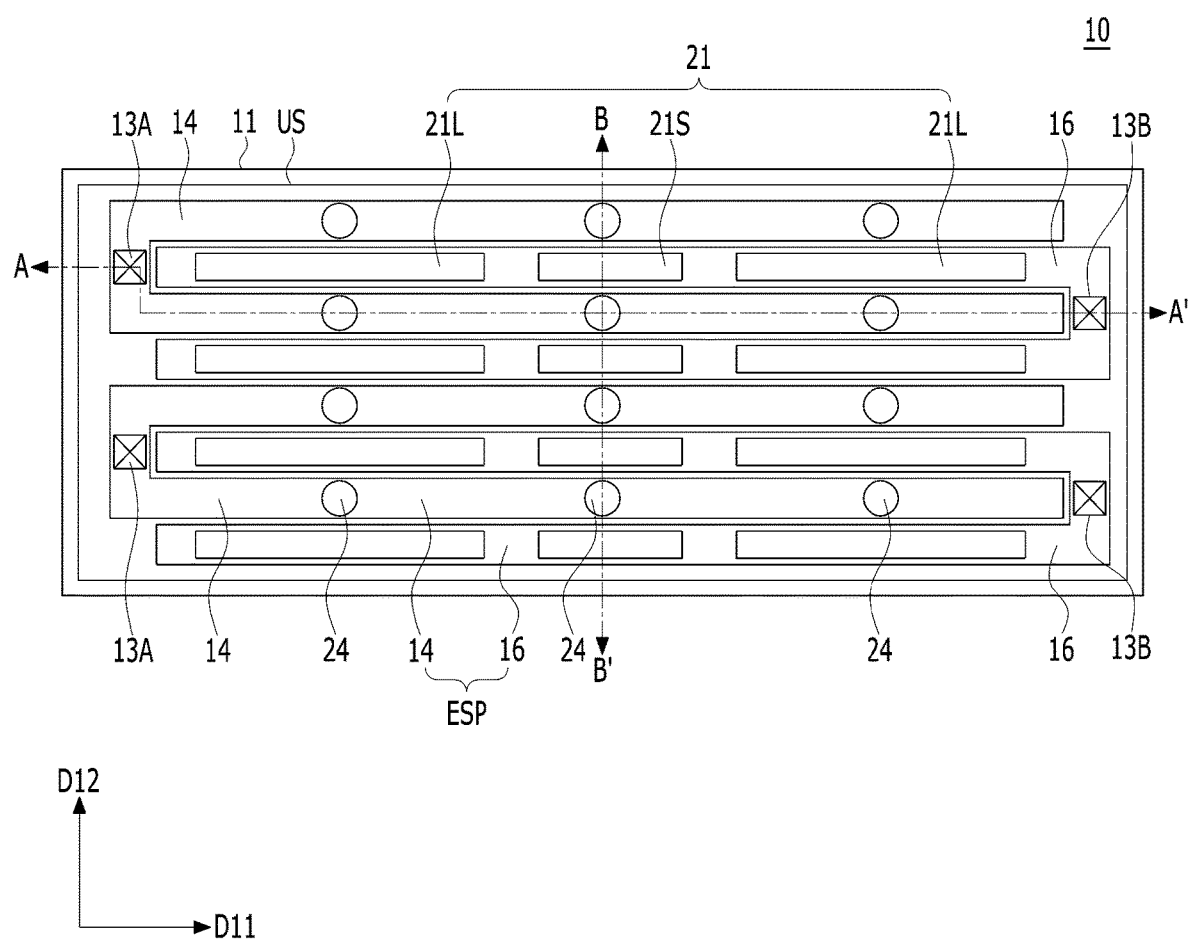
FIG. 1 is a plan view illustrating an etch stopper pad of a semiconductor device in accordance with an embodiment of the present invention.

Embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a plan view illustrating an etch stopper pad of a semiconductor device 10 in accordance with an embodiment of the present invention. FIGS. 2 to 9 are cross-sectional views illustrating a method for fabricating a semiconductor device in accordance with an embodiment of the present invention. FIGS. 2 to 9 describe a method for fabricating a semiconductor device by presenting cross-sections of the semiconductor device 10 taken along lines A-A' and B-B' shown in FIG. 1.

Referring to FIG. 1, the semiconductor device 10 may include an etch stopper pad ESP. The etch stopper pad ESP may be formed over the substrate 11, and an etch target layer US may be formed over the etch stopper pad ESP. The etch stopper pad ESP may be positioned between the substrate 11 and the etch target layer US.

The etch stopper pad ESP may include first sacrificial pads 14, and second sacrificial pads 16 over the substrate 11. Each of the first sacrificial pads 14 and the second sacrificial pads 16 may extend in a first direction D11. The first sacrificial pads 14 and the second sacrificial pads 16 may not overlap with each other in a second direction D12. Each of the first sacrificial pads 14 and the second sacrificial pads 16 may have a bended shape. For example, the first sacrificial pads 14 may have a '⊂' shape, and the second sacrificial pads 16 may have a '⊃' shape. The first sacrificial pads 14 and the second sacrificial pads 16 may not contact each other. The first sacrificial pads 14 and the second sacrificial pads 16 may be positioned at different levels. First sacrificial plugs 13A may be positioned below the first sacrificial pads 14. The second sacrificial plugs 13B may be positioned below the second sacrificial pads 16. Each of the first sacrificial plugs 13A and the second sacrificial plugs 13B may be coupled to the substrate 11.

The etch target layer US may be formed over the first and second sacrificial pads 14 and 16. A plurality of first openings 21 and a plurality of second openings 24 penetrating the etch target layer US may be formed. The first openings 21 and the second openings 24 may be formed by etching the etch target layer US. The etching process for forming the first openings 21 may stop at the second sacrificial pads 16. The etching process for forming the second openings 24 may stop at the first sacrificial pads 14.

The first sacrificial pad 14 and the second sacrificial pad 16 may include a metal-based material. The first sacrificial pad 14 and the second sacrificial pad 16 may include a metal nitride, a metal, or a combination thereof. According to the embodiment of the present invention, the first sacrificial pad 14 and the second sacrificial pad 16 may each include a stack of a tungsten layer and a titanium nitride layer.

The etch target layer US may include a dielectric layer, a semiconductor layer, or a combination thereof. The etch target layer US may include silicon oxide, silicon nitride, monocrystalline silicon, polysilicon, silicon germanium, or a combination thereof. The etch target layer US may include an alternating stack. According to the embodiment of the present invention, the etch target layer US may include an alternating stack of ONPN or an alternating stack of ON. The alternating stack of ONPN may refer to a stack in which silicon oxide-silicon nitride-polysilicon-silicon nitride are alternately stacked. According to another embodiment of the present invention, the alternating stack of ONPN may refer to a stack in which silicon oxide-silicon nitride-monocrystalline silicon-silicon nitride are alternately stacked. The ON stack may refer to a stack in which silicon oxide and silicon nitride are alternately stacked. According to another embodiment of the present invention, the etch target layer US may include an alternating stack of SGSG, and the alternating stack of SGSG may refer to a stack in which monocrystalline silicon and silicon germanium are alternately stacked.

The first sacrificial pads 14 and the second sacrificial pads 16 of the etch stopper pad ESP may serve as an etch stop layer during an etching process of the etch target layer US. The second sacrificial pads 16 may serve as an etch stop layer while the first openings 21 are formed by etching the etch target layer US. The first sacrificial pads 14 may serve as an etch stop layer while the second openings 24 are formed by etching the etch target layer US. Each of the first openings 21 may include small openings 21S and large openings 21L. The large openings 21L may be larger than the small openings 21S. The second openings 24 may be smaller than the small openings 21S. The first openings 21 may have a rectangular shape, and the second openings 24 may have a circular shape.

The etch stopper pad ESP may serve to discharge the charges induced during the etching process of the etch target layer US to the substrate 11. The charges induced while the first openings 21 are formed by etching the target layer US may be discharged to the substrate 11 through the second sacrificial pads 16 and the second sacrificial plugs 13B. The charges induced while the second openings 24 are formed by etching the etch target layer US may be discharged to the substrate 11 through the first sacrificial pads 14 and the first sacrificial plugs 13A.

Hereinafter, an embodiment of a method for fabricating a semiconductor device by using the etch stopper pad ESP of FIG. 1 will be described.

Figure 2:
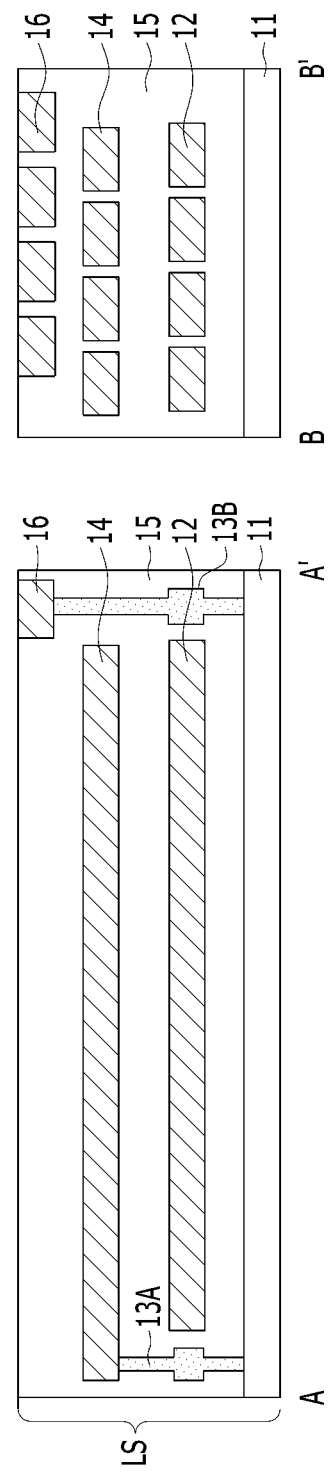
FIGS. 2 to 9 are cross-sectional views illustrating a method for fabricating a semiconductor device in accordance with an embodiment of the present invention.

Referring to FIGS. 1 and 2, a lower structure LS may include the substrate 11. The lower structure LS may include first and second sacrificial plugs 13A and 13B, a metal pad 12, a first sacrificial pad 14, a second sacrificial pad 16, and an inter-layer dielectric layer 15. The first and second sacrificial plugs 13A and 13B may be discharge contacts. The first and second sacrificial plugs 13A and 13B and the metal pad 12 may include a metal-based material. For example, the first and second sacrificial plugs 13A and 13B and the metal pad 12 may include tungsten. The first sacrificial pad 14 and the second sacrificial pad 16 may include a metal-based material. For example, the first sacrificial pad 14 and the second sacrificial pad 16 may include a metal nitride, a metal, or a combination thereof. According to the embodiment of the present invention, each of the first sacrificial pad 14 and the second sacrificial pad 16 may include a stack of a tungsten layer and a titanium nitride layer. The metal pad 12 may be positioned at a lower level than the first sacrificial pad 14, and the second sacrificial pad 16 may be positioned at a higher level than the first sacrificial pad 14. The first sacrificial pad 14 may be coupled to the substrate 11 through the first sacrificial plug 13A. The second sacrificial pad 16 may be coupled to the substrate 11 through the second sacrificial plug 13B.

A method of forming the lower structure LS will be described with reference to FIGS. 10A to 10F.

Figure 3:
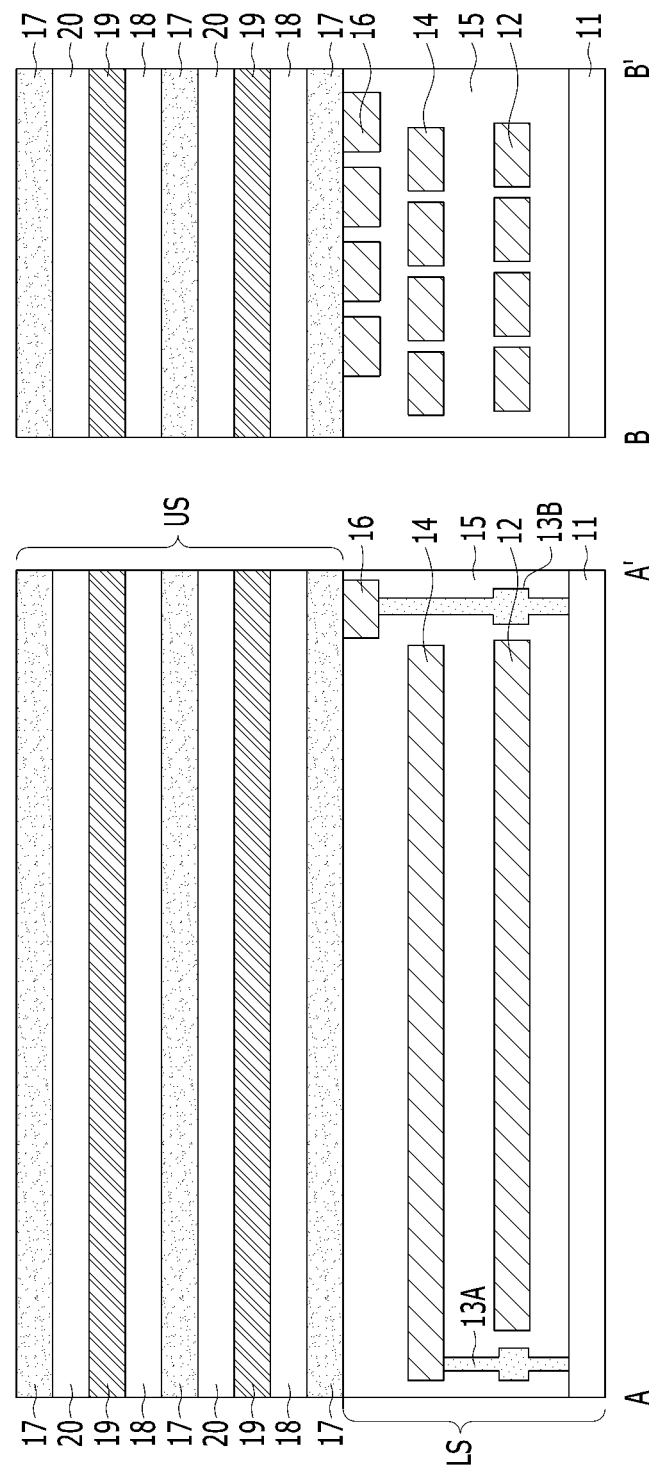

Referring to FIGS. 1 and 3, the etch target layer US may be formed over the second sacrificial pad 16 and the inter-layer dielectric layer 15. The etch target layer US may include an alternating stack. The etch target layer US may be formed by stacking a first dielectric layer 17, a second dielectric layer 18, a semiconductor layer 19, and a third dielectric layer 20 in the mentioned order several times, and the uppermost layer of the etch target layer US may be the first dielectric layer 17. The first dielectric layers 17 may include silicon oxide, and the second dielectric layers 18 and the third dielectric layers 20 may include silicon nitride. The semiconductor layers 19 may include monocrystalline silicon or polysilicon. According to the embodiment of the present invention, the etch target layer US may be formed by alternately stacking silicon oxide-silicon nitride-polysilicon-silicon nitride, which is an ONPN stack.

Figure 4:
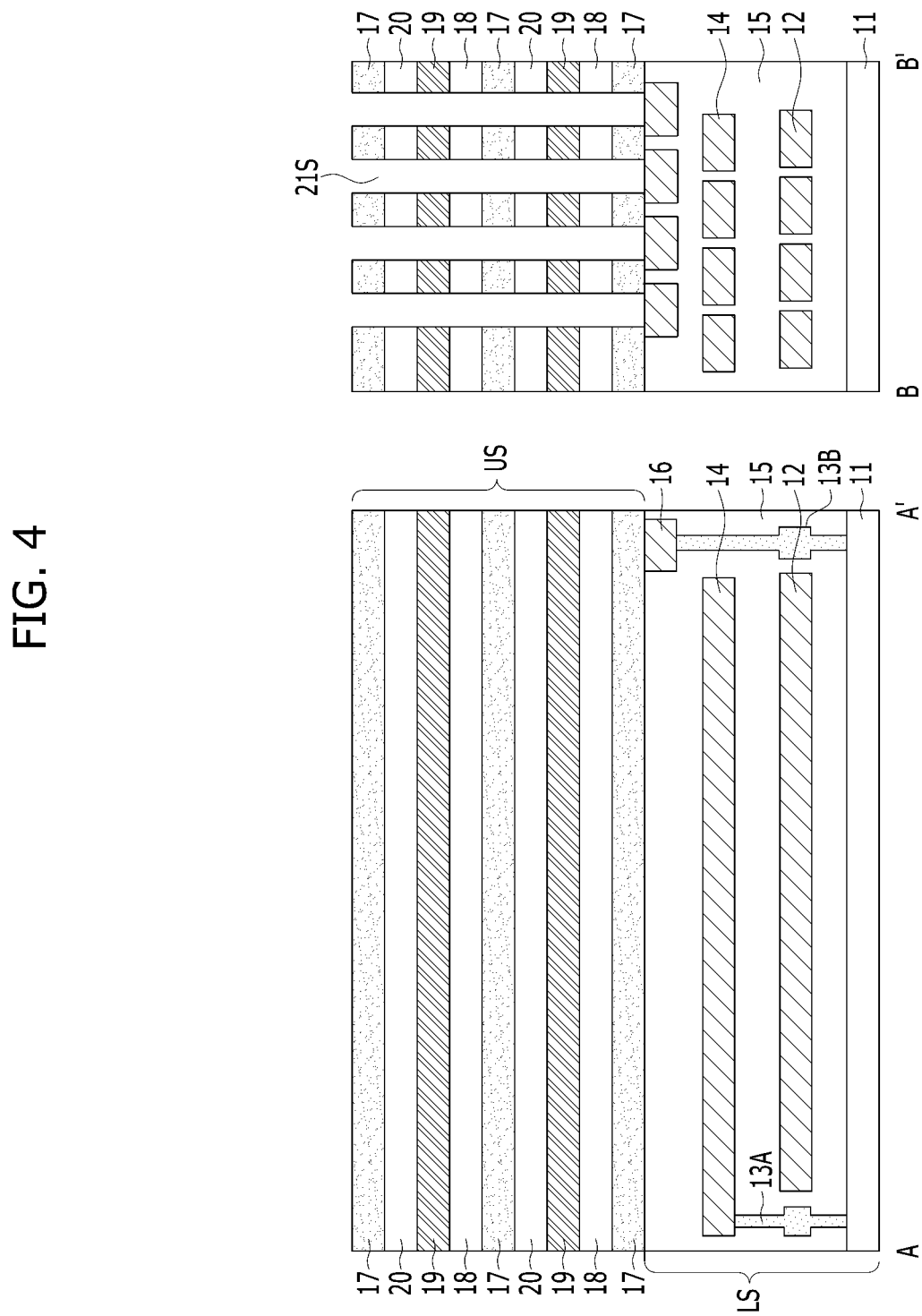

Referring to FIGS. 1 and 4, the first openings 21 may be formed by etching a portion of the etch target layer US. The etching process for forming the first openings 21 may stop at the second sacrificial pads 16. Referring to FIG. 1, the first openings 21 may include the small openings 21S and the large openings 21L. The small openings 21S and the large openings 21L may have a square, oval, or circle shape. The etching process for forming the first openings 21 may include plasma etching, and the charges induced by the plasma etching process may be discharged to the substrate 11 through the second sacrificial plug 13B.

Figure 5:
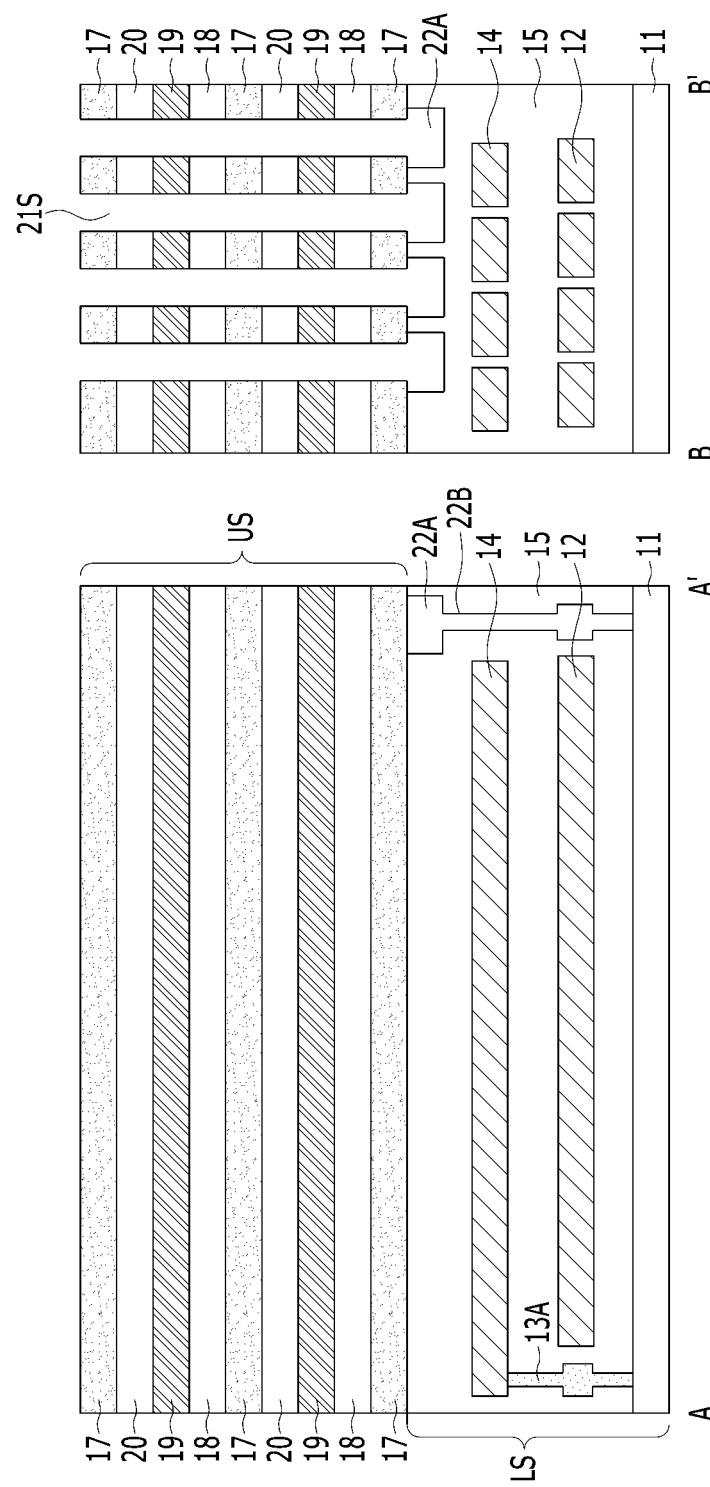

Referring to FIG. 5, the second sacrificial pads 16 may be stripped through the first openings 21. Accordingly, a space from which the second sacrificial pads 16 are removed may remain as a first pad-type air gap 22A. The first pad-type air gap 22A may be positioned below the first openings 21. While the second sacrificial pads 16 are removed, the second sacrificial plugs 13B may also be stripped. Accordingly, a first plug-type air gap 22B may be formed below the first pad-type air gap 22A, and the first plug-type air gap 22B may expose the substrate 11.

Figure 6:
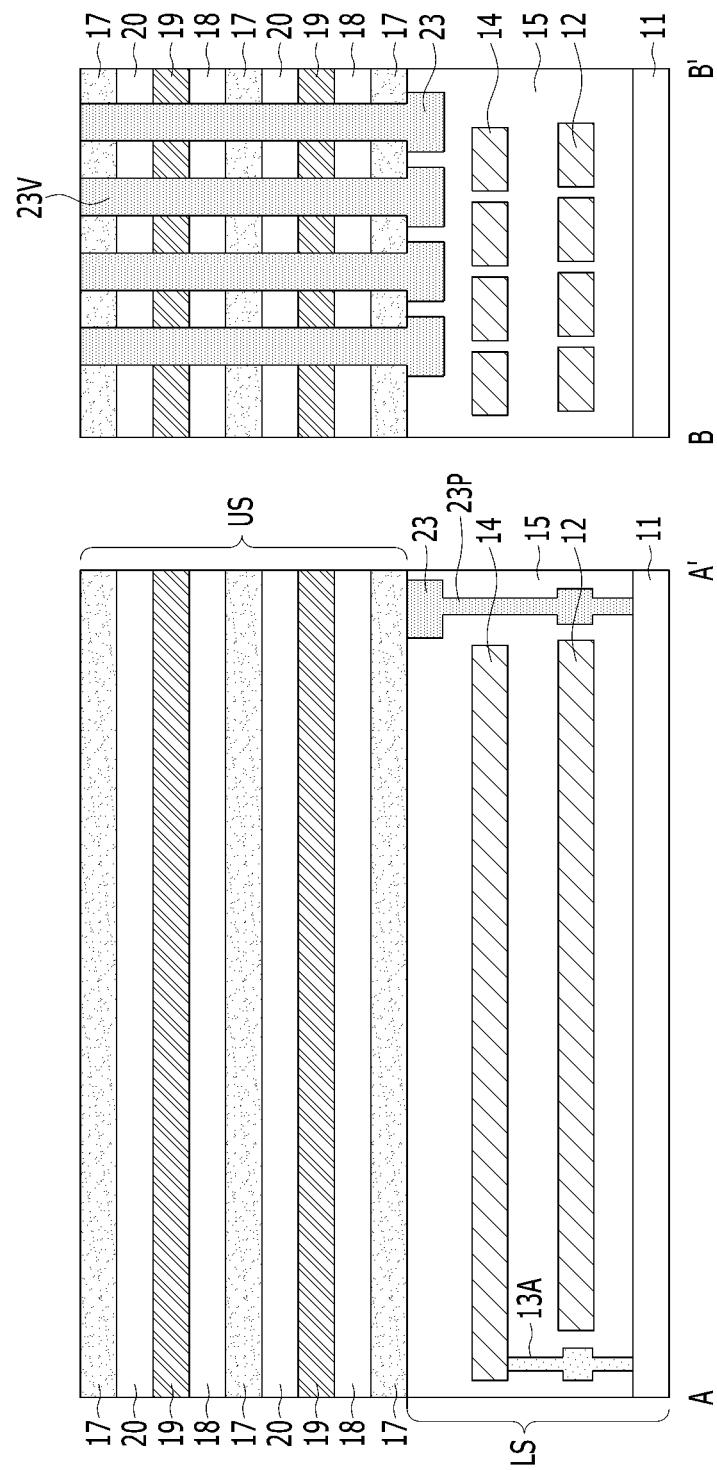

Referring to FIG. 6, a first gap-fill layer 23, 23V and 23P filling the first pad-type air gap 22A, the first plug-type air gap 22B, and the first openings 21 may be formed. The first gap-fill layer 23, 23V, and 23P may include silicon oxide. The first gap-fill layer 23, 23V and 23P may include first vertical isolation portions 23V filling the first openings 21, upper-level insulating pads 23 filling the first pad-type air gaps 22A, and upper-level insulating plugs 23P filling the first plug-type air gaps 22B. The upper-level insulating plugs 23P may contact the substrate 11, and the upper-level insulating pads 23 may be positioned between the first vertical isolation portions 23V and the upper-level insulating plugs 23P.

Figure 7:
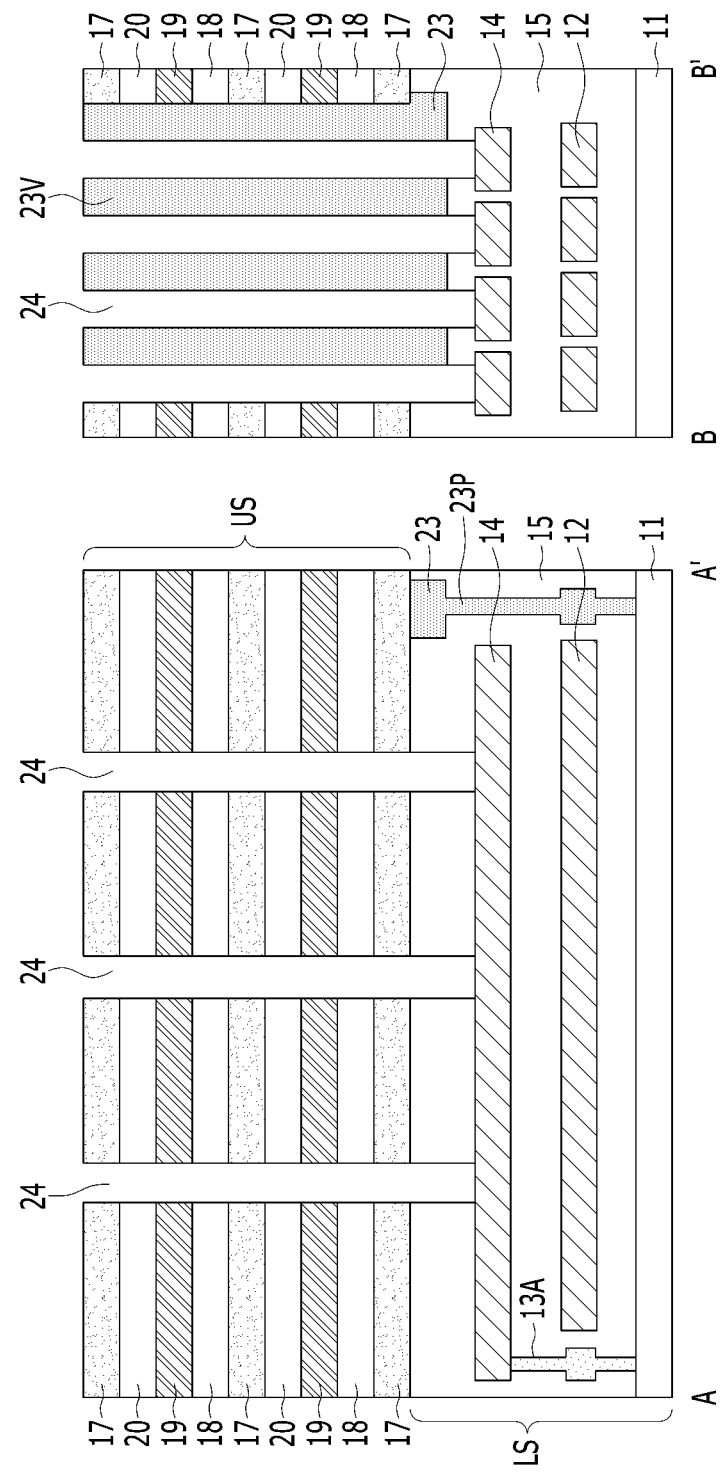

Referring to FIGS. 1 and 7, a plurality of second openings 24 positioned adjacent to the first vertical isolation portions 23V may be formed by etching another portion of the etch target layer US. The etching process for forming the second openings 24 may further etch the inter-layer dielectric layer 15 to stop at the first sacrificial pads 14. From the perspective of a top view, the second openings 24 may have the same size from each other. The second openings 24 may have a rectangular, oval or circular shape. The etching process for forming the second openings 24 may include plasma etching, and the charges induced by the plasma etching process may be discharged to the substrate 11 through the first sacrificial pads 14 and the first sacrificial plugs 13A.

Figure 8:
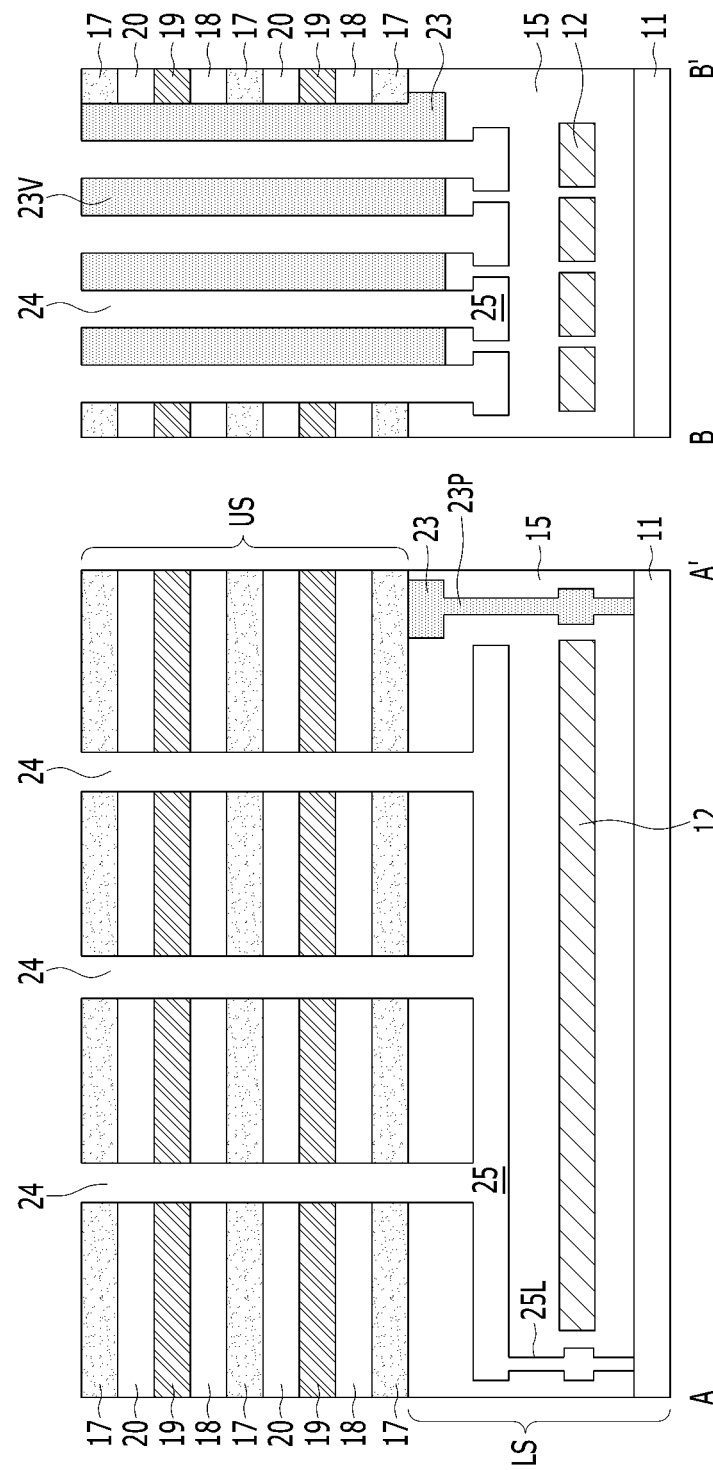

Referring to FIG. 8, the first sacrificial pads 14 may be stripped. Accordingly, a space from which the first sacrificial pads 14 are removed may remain as a second pad-type air gap 25. The second pad-type air gaps 25 may be positioned below the second openings 24. While the first sacrificial pads 14 are removed, the first sacrificial plugs 13A may also be stripped. A second plug-type air gap 25L may be formed below the second pad-type air gap 25, and the second plug-type air gap 25L may expose the substrate 11.

Figure 9:
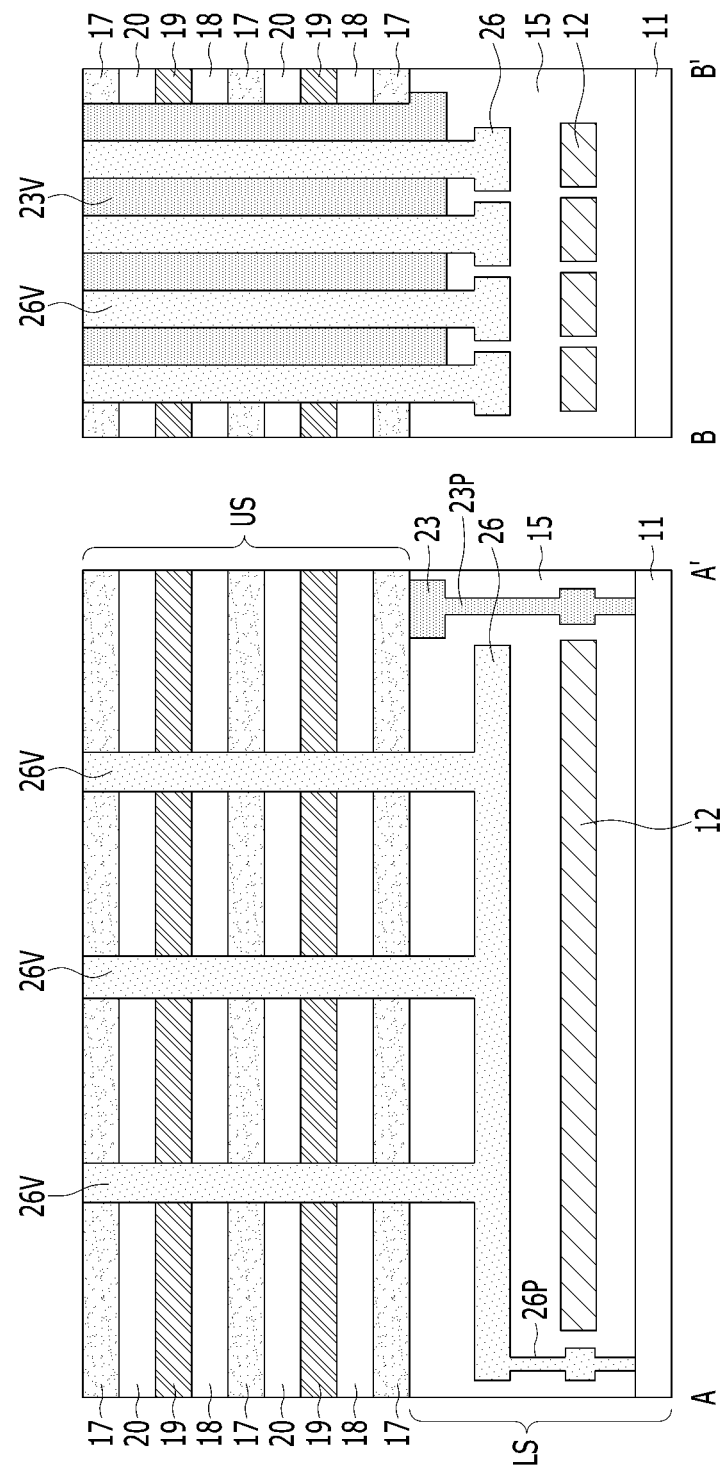

Referring to FIG. 9, second gap-filling layers 26, 26V, and 26P filling the second openings 24, the second air gap 25, and the second plug-type air gap 25L may be formed. The second gap-filling layers 26, 26V and 26P may include silicon oxide. The second gap-filling layers 26, 26V and 26P may include a second vertical isolation portion 26V filling the second openings 24, lower-level insulating pads 26 filling the second pad-type air gap 25, and lower-level insulating plugs 26P filling the second plug-type air gap 25L. The lower-level insulating plugs 26P may contact the substrate 11, and the lower-level insulating pads 26 may be positioned between the second vertical isolation portions 26V and the lower-level insulating plugs 26P. Upper surfaces of the lower-level insulating plugs 26P may be positioned at a lower level than upper surfaces of the upper-level insulating plugs 23P.

According to the above-described embodiment of the present invention, since the first sacrificial pads 14 and the second sacrificial pads 16 are used as etch stop layers during a high aspect ratio etching process of the etch target layer US which is formed of a stack of different materials, it is possible to prevent arcing by plasma.

FIGS. 10A to 10F are cross-sectional views illustrating a method for forming a lower structure shown in FIG. 2.

Figure 10A:
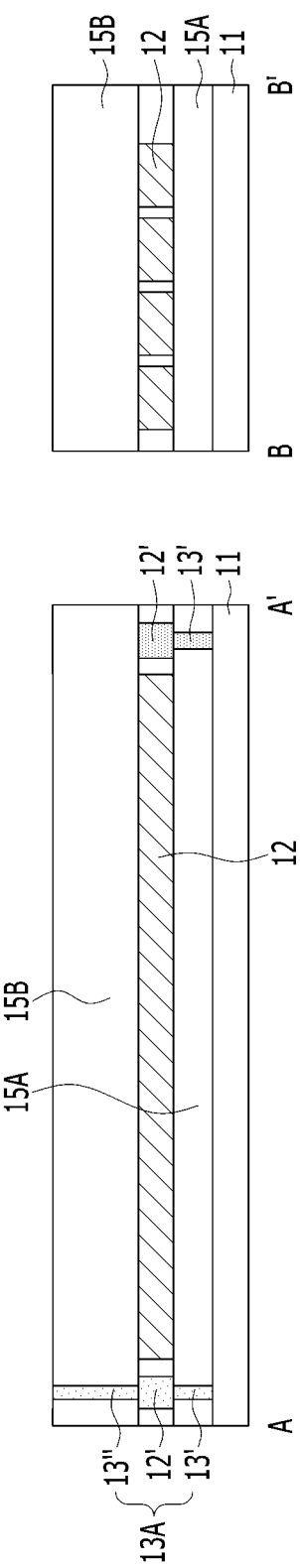
FIGS. 10A to 10F are cross-sectional views illustrating a method for forming a lower structure shown in FIG. 2.

Referring to FIG. 10A, first sacrificial plugs 13A, a metal pad 12, and first and second inter-layer dielectric layers 15A and 15B may be formed over the substrate 11. The first and second sacrificial plugs 13A may be discharge contacts. The first sacrificial plugs 13A and the metal pad 12 may include a metal-based material. For example, the first sacrificial plugs 13A and the metal pad 12 may include tungsten.

The first sacrificial plugs 13A may include a stack of a first metal plug 13', a first metal interconnection 12', and a second metal plug 13". The first inter-layer dielectric layer 15A may be formed over the substrate 11, and the first metal plugs 13' penetrating the first inter-layer dielectric layer 15A may be formed. The first metal interconnections 12' may be formed over the first metal plugs 13'. While the first metal interconnections 12' are formed, the metal pad 12 may be formed over the first inter-layer dielectric layer 15A. The second inter-layer dielectric layer 15B may be formed over the metal pad 12 and the first metal interconnections 12'. The second metal plugs 13" penetrating the second inter-layer dielectric layer 15B may be formed, and the second metal plugs 13" may be coupled to at least one first metal interconnection 12'. The first and second inter-layer dielectric layers 15A and 15B may include silicon oxide, silicon nitride, or a combination thereof. The second metal plugs 13" may include a stack of titanium nitride and tungsten that are stacked in the mentioned order, that is, a TiN/W stack. According to another embodiment of the present invention, the metal pad 12 and the first metal interconnections 12' may be formed by a Damascene process, and the second inter-layer dielectric layer 15B may be formed after an etch stop layer (not shown) such as silicon nitride is formed over the first metal interconnections 12'.

Figure 10B:
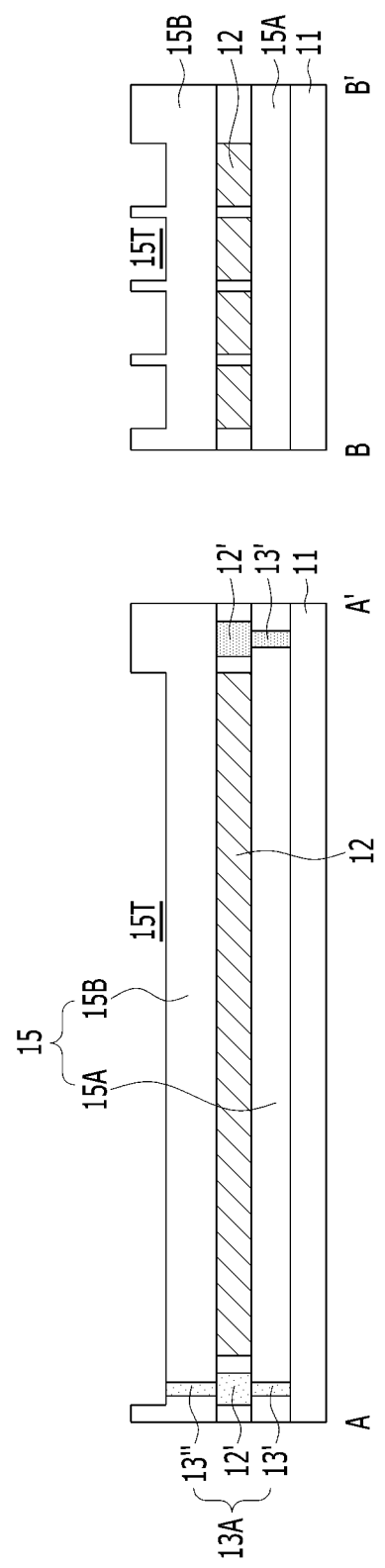

Referring to FIG. 10B, first trenches 15T may be formed by partially etching the second inter-layer dielectric layer 15B. The first trenches 15T may expose the second metal plugs 13".

Figure 10C:
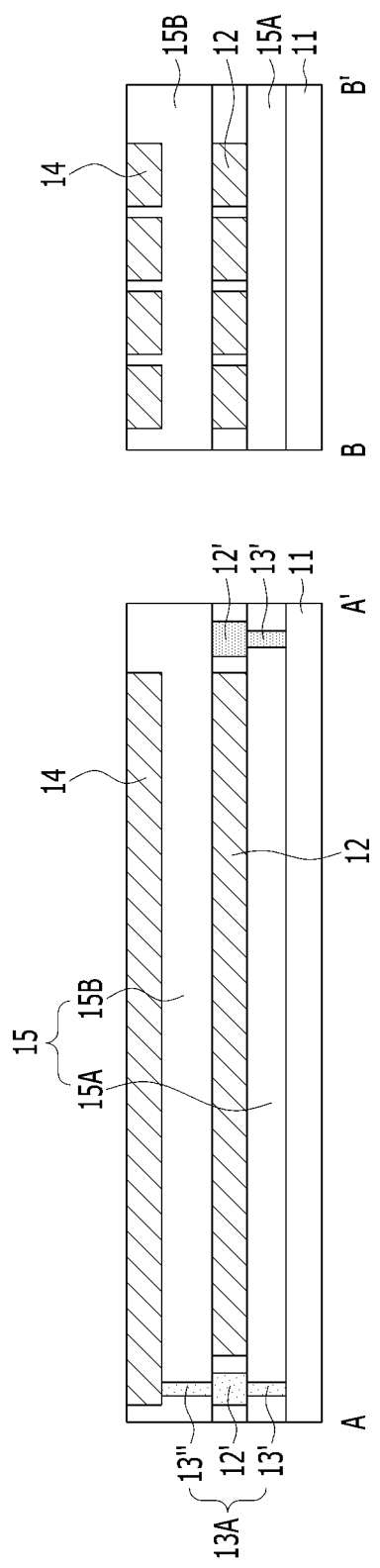

Referring to FIG. 10C, the first sacrificial pad 14 filling the first trenches 15T may be formed. The first sacrificial pad 14 may include a metal-based material. The first sacrificial pad 14 may include a metal nitride, a metal, or a combination thereof. According to the embodiment of the present invention, the first sacrificial pad 14 may include a TiN/W stack or a TiN/W/TiN stack. The TiN/W stack may refer to a structure in which tungsten is formed over titanium nitride. The TiN/W/TiN stack may refer to a structure in which a first titanium nitride, tungsten, and a second titanium nitride are deposited in the mentioned order. For example, after tungsten deposition and etch-back process are performed to partially fill the first trenches 15T, titanium nitride may be formed over the tungsten.

Figure 10D:
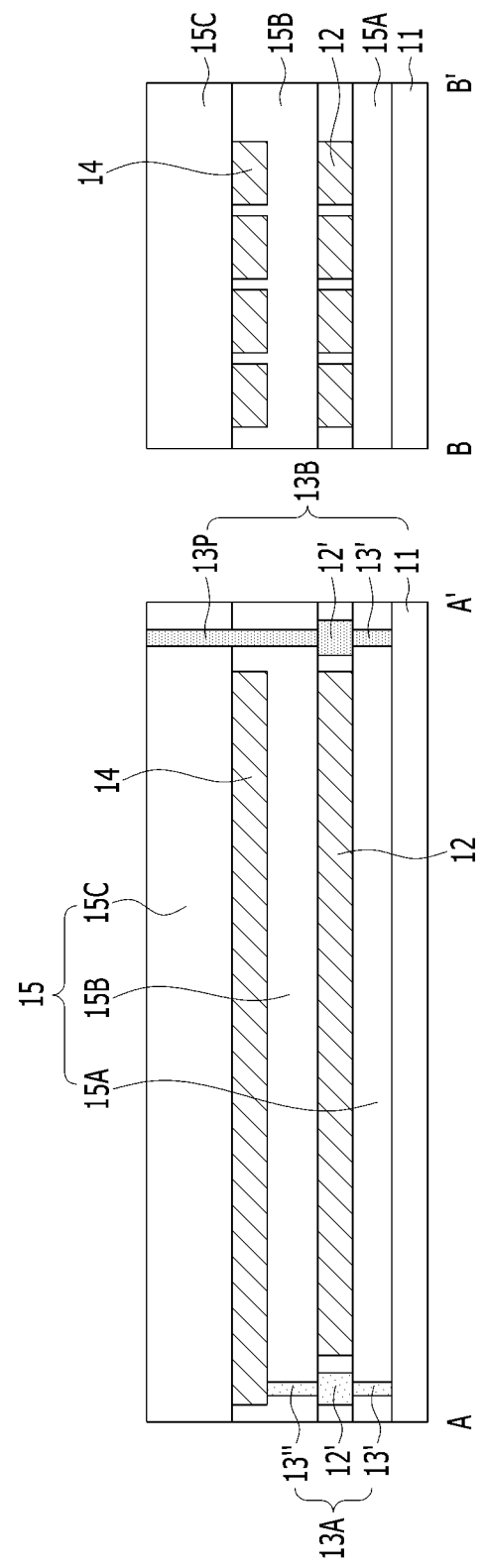

Referring to FIG. 10D, the third inter-layer dielectric layer 15C may be formed over the first sacrificial pad 14. A third metal plug 13P coupled to the first metal interconnection 12' by penetrating the third inter-layer dielectric layer 15C may be formed. The third inter-layer dielectric layer 15C may include silicon oxide, silicon nitride, or a combination thereof. The third metal plugs 13P may include a stack of titanium nitride and tungsten.

The stack of the first metal plug 13', the first metal interconnection 12', and the third metal plug 13P may become the second sacrificial plug 13B.

Figure 10E:
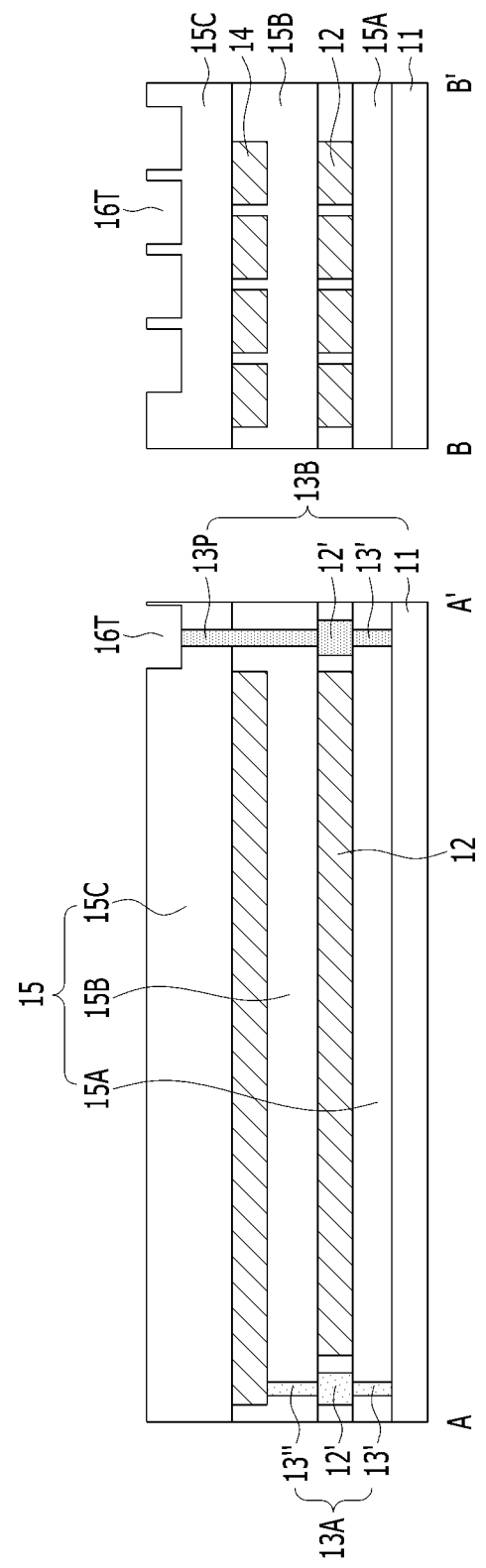

Referring to FIG. 10E, the second trenches 16T may be formed by partially etching the third inter-layer dielectric layer 15C and the third metal plug 13P. The heights of the third metal plugs 13P may be lowered by the second trenches 16T.

Figure 10F:
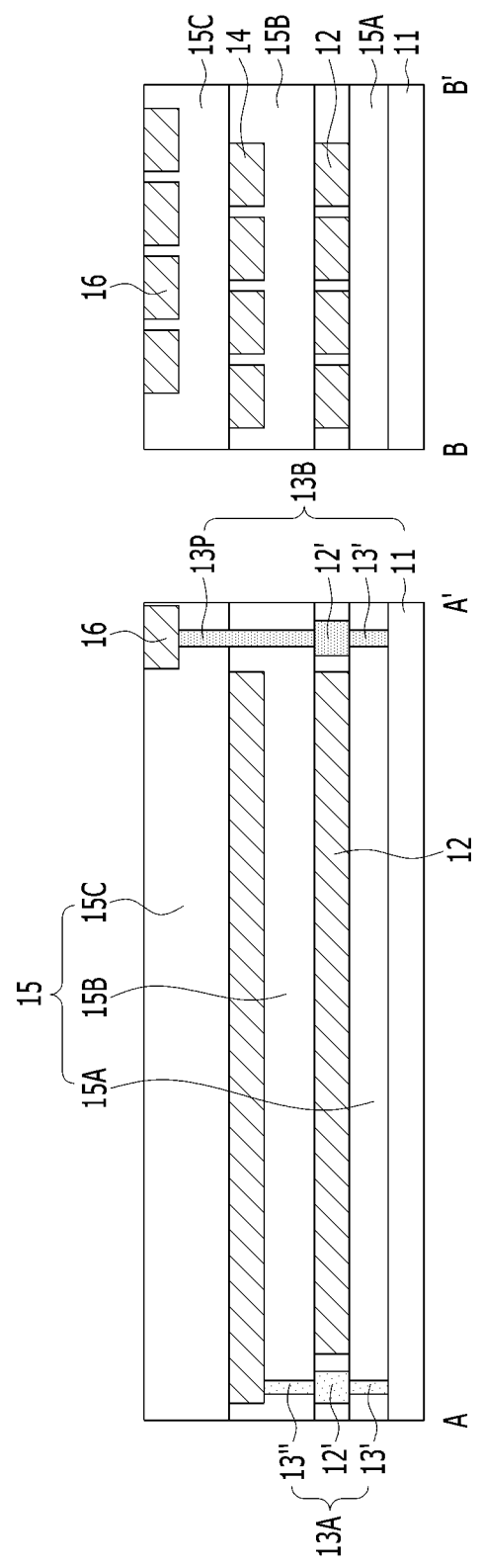

Referring to FIG. 10F, the second sacrificial pad 16 filling the second trenches 16T may be formed. The second sacrificial pad 16 may include a metal-based material. The second sacrificial pad 16 may include a metal nitride, a metal, or a combination thereof. According to the embodiment of the present invention, the second sacrificial pad 16 may include a TiN/W stack or a TiN/W/TiN stack. The TiN/W stack may refer to a structure in which tungsten is formed over titanium nitride. The TiN/W/TiN stack may refer to a structure in which a first titanium nitride, tungsten, and a second titanium nitride are deposited in the mentioned order. For example, after tungsten deposition and an etch-back process are performed to partially fill the second trenches 16T, titanium nitride may be formed over the tungsten.

Figure 11A:
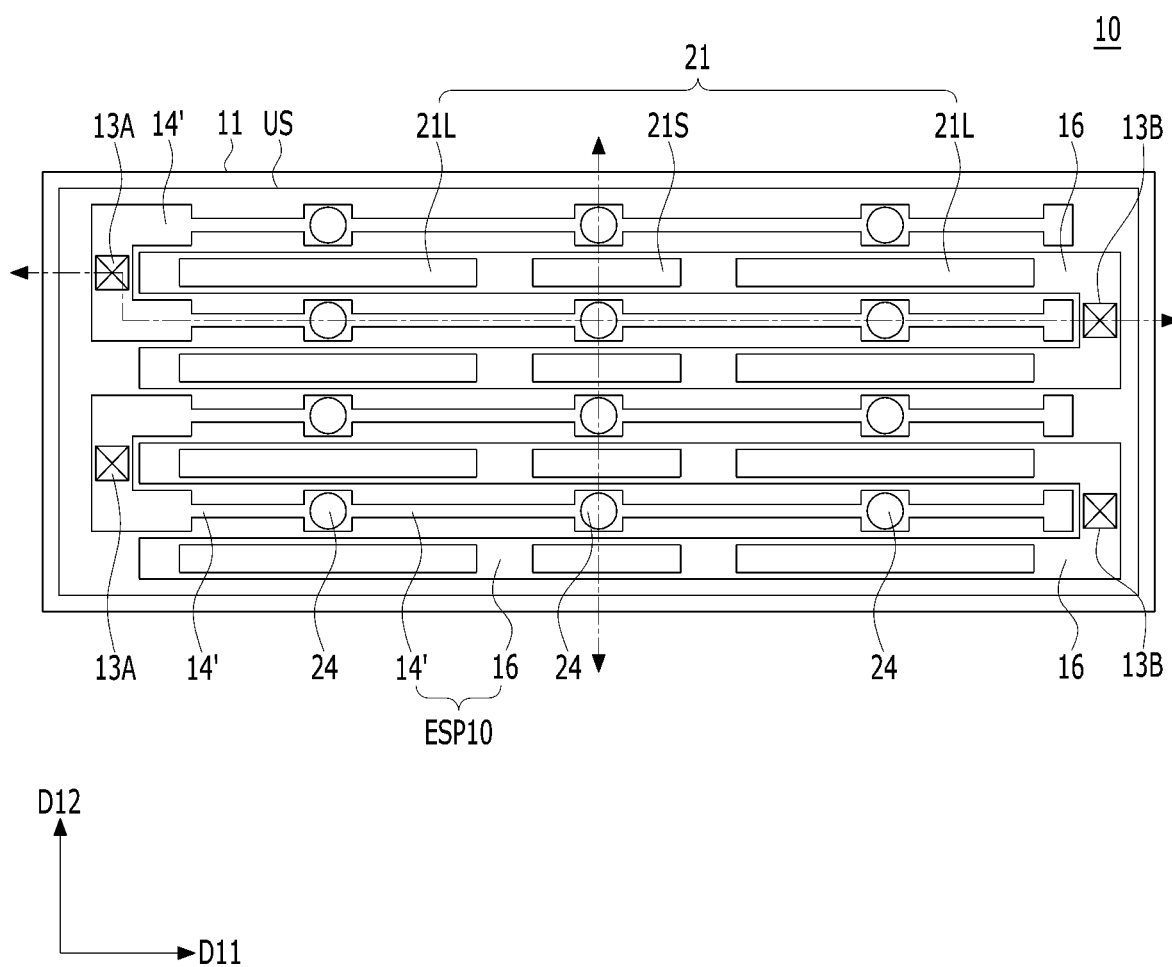
FIG. 11A is a plan view illustrating an etch stopper pad in accordance with another embodiment of the present invention.
Figure 11B:
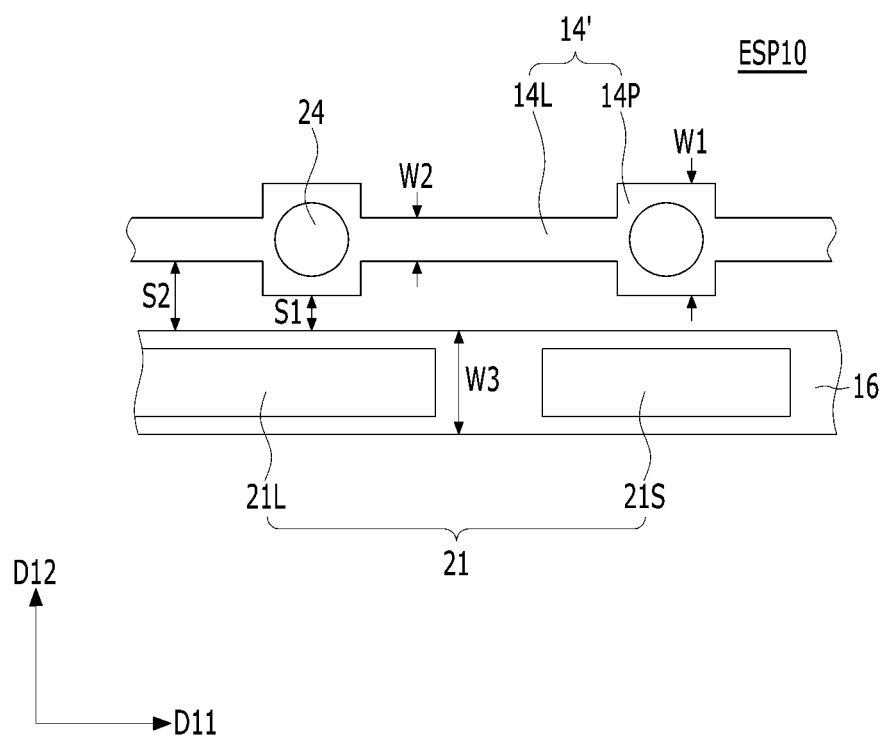
FIG. 11B is a partially enlarged view of the etch stopper pad shown in FIG. 11A.

FIG. 11A is a plan view illustrating the etch stopper pad in accordance with another embodiment of the present invention. FIG. 11B is a partially enlarged view of the etch stopper pad shown in FIG. 11A. The etch stopper pad ESP10 of FIG. 11A may be similar to the etch stopper pad ESP of FIG. 1. Hereinafter, detailed descriptions on the constituent elements that appear throughout the figures will be omitted.

Referring to FIGS. 11A and 11B, the semiconductor device 10 may include the etch stopper pad ESP10. The etch stopper pad ESP10 may be formed over the substrate 11, and an etch target layer US may be formed over the etch stopper pad ESP10. The etch stopper pad ESP10 may be positioned between the substrate 11 and the etch target layer US.

The etch stopper pad ESP10 may include first sacrificial plugs 13A, first sacrificial pads 14', second sacrificial plugs 13B, and second sacrificial pads 16 over the substrate 11. The first sacrificial pad 14' and the second sacrificial pad 16 may extend in the first direction D11. The first sacrificial pad 14' and the second sacrificial pad 16 may be spaced apart from each other in the second direction D12.

Each of the first sacrificial pads 14' and the second sacrificial pads 16 may have a bended shape. For example, the first sacrificial pads 14' may have a '⊂' shape, and the second sacrificial pads 16 may have a '⊃' shape. The first sacrificial pads 14' and the second sacrificial pads 16 may not contact each other. The first sacrificial pads 14' and the second sacrificial pads 16 may be positioned at different levels. The first sacrificial pads 14' may be positioned at a lower level than the second sacrificial pads 16. The first sacrificial plugs 13A may be positioned below the first sacrificial pads 14', and second sacrificial plugs 13B may be positioned below the second sacrificial pads 16. Each of the first sacrificial plugs 13A and the second sacrificial plugs 13B may be coupled to the substrate 11.

The first sacrificial pad 14' may have a dog-bone shape. The first sacrificial pad 14' may include a first portion 14P and a second portion 14L extending from the first portion 14P. The first portion 14P and the second portion 14L may be integrated, and the dog-bone shape of the first sacrificial pad 14' may be defined by a combination of a plurality of the first portions 14P and a plurality of the second portions 14L. The first portion 14P may be referred to as a protrusion portion, and the second portion 14L may be referred to as a line portion. The first portion 14P may have a first width W1 which is parallel to the second direction D2, and the second portion 14L may have a second width W2 which is parallel to the second direction D2. The first width W1 may be greater than the second width W2. The second sacrificial pad 16 may have a third width W3 which is parallel to the second direction D12. The third width W3 may be greater than the second width W2 and may be the same as the first width W1.

A first distance S1 between the first portion 14P of the first sacrificial pad 14' and the second sacrificial pad 16 may be smaller than a second distance S2 between the second portion 14L of the first sacrificial pad 14' and the second sacrificial pad 16.

In the plane of FIG. 11B, the first portion 14P may have a rectangular shape, and the second opening 24 may have a circle shape. According to another embodiment of the present invention, each of the first portion 14P and the second opening 24 may have a square shape or a circle shape. The second opening 24 may be positioned at the center of the first portion 14P.

Figure 12:
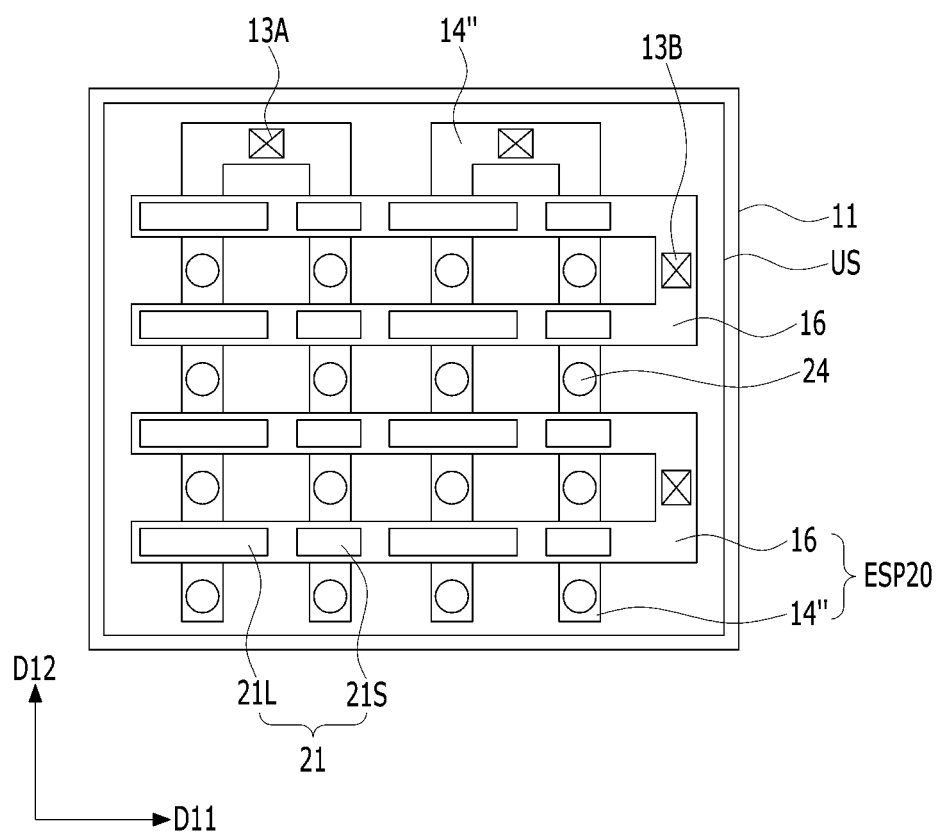
FIG. 12 is a plan view illustrating an etch stopper pad in accordance with another embodiment of the present invention.

FIG. 12 is a plan view illustrating an etch stopper pad in accordance with another embodiment of the present invention. The etch stopper pad ESP20 of FIG. 12 may be similar to the etch stopper pad ESP of FIG. 1. Hereinafter, detailed descriptions on the constituent elements that appear throughout the figures will be omitted.

Referring to FIG. 12, the semiconductor device 10 may include an etch stopper pad ESP20. The etch stopper pad ESP20 may be formed over the substrate 11, and an etch target layer US may be formed over the etch stopper pad ESP20. The etch stopper pad ESP20 may be positioned between the substrate 11 and the etch target layer US.

The etch stopper pad ESP20 may include the first sacrificial pads 14", and second sacrificial pads 16 over the substrate 11. The first sacrificial pads 14" and the second sacrificial pads 16 may intersect with each other. The second sacrificial pads 16 may extend in the first direction D11, and the first sacrificial pads 14" may extend in the second direction D12. Each of the first sacrificial pads 14" and the second sacrificial pads 16 may have a bended shape. For example, the first sacrificial pads 14" may have a '∩' shape, and the second sacrificial pads 16 may have a '⊃' shape. The first sacrificial pads 14" and the second sacrificial pads 16 may not contact each other. The first sacrificial pads 14" and the second sacrificial pads 16 may be positioned at different levels. The first sacrificial pads 14" may be positioned at a lower level than the second sacrificial pads 16. The first sacrificial plugs 13A may be positioned below the first sacrificial pads 14". The second sacrificial plugs 13B may be positioned below the second sacrificial pads 16. Each of the first sacrificial plugs 13A and the second sacrificial plugs 13B may be coupled to the substrate 11.

Referring back to FIGS. 11A and 12, an etch target layer US may be formed over the first sacrificial pads 14' and 14" and the second sacrificial pads 16. A plurality of first openings 21 and a plurality of second openings 24 penetrating the etch target layer US may be formed. The first openings 21 and the second openings 24 may be formed by etching the etch target layer US. The etching process for forming the first openings 21 may stop at the second sacrificial pads 16. The etching process for forming the second openings 24 may stop at the first sacrificial pads 14' and 14".

The first sacrificial pads 14' and 14" and the second sacrificial pad 16 may include a metal nitride, a metal, or a combination thereof. According to the embodiment of the present invention, each of the first sacrificial pads 14' and 14" and the second sacrificial pad 16 may include a stack of a tungsten layer and a titanium nitride layer.

The etch target layer US may include an alternating stack. The etch target layer US may include a dielectric layer, a semiconductor layer, or a combination thereof. The etch target layer US may include silicon oxide, silicon nitride, monocrystalline silicon, polysilicon, silicon germanium, or a combination thereof. According to the embodiment of the present invention, the etch target layer US may include an alternating stack of ONPN or an alternating stack of ON. The alternating stack of ONPN may refer to a stack in which silicon oxide-silicon nitride-polysilicon-silicon nitride are alternately stacked. According to another embodiment of the present invention, the alternating stack of ONPN may refer to a stack in which silicon oxide-silicon nitride-monocrystalline silicon-silicon nitride are alternately stacked. The ON stack may refer to a stack in which silicon oxide and silicon nitride are alternately stacked.

The first sacrificial pads 14' and 14" and the second sacrificial pads 16 may serve as an etch stop layer during an etching process of the etch target layer US. The second sacrificial pads 16 may serve as an etch stop layer while the first openings 21 are formed by etching the target layer US. The first sacrificial pads 14' and 14" may serve as an etch stop layer while the second openings 24 are formed by etching the etch target layer US. Each of the first openings 21 may include small openings 21S and large openings 21L. The large openings 21L may be larger than the small openings 21S. The second openings 24 may be smaller than the small openings 21S. The first openings 21 may have a rectangular shape, and the second openings 24 may have a circle shape.

The etch stopper pads ESP10 and ESP20 of FIGS. 11A and 12 may serve to discharge the charges induced during the etching process of the etch target layer US to the substrate 11. The charges induced while the first openings 21 are formed by etching the target layer US may be discharged to the substrate 11 through the second sacrificial pads 16 and the second sacrificial plugs 13B. The charges induced while the second openings 24 are formed by etching the target layer US may be discharged to the substrate 11 through the first sacrificial pads 14' and 14" and the first sacrificial plugs 13A.

Figure 13:
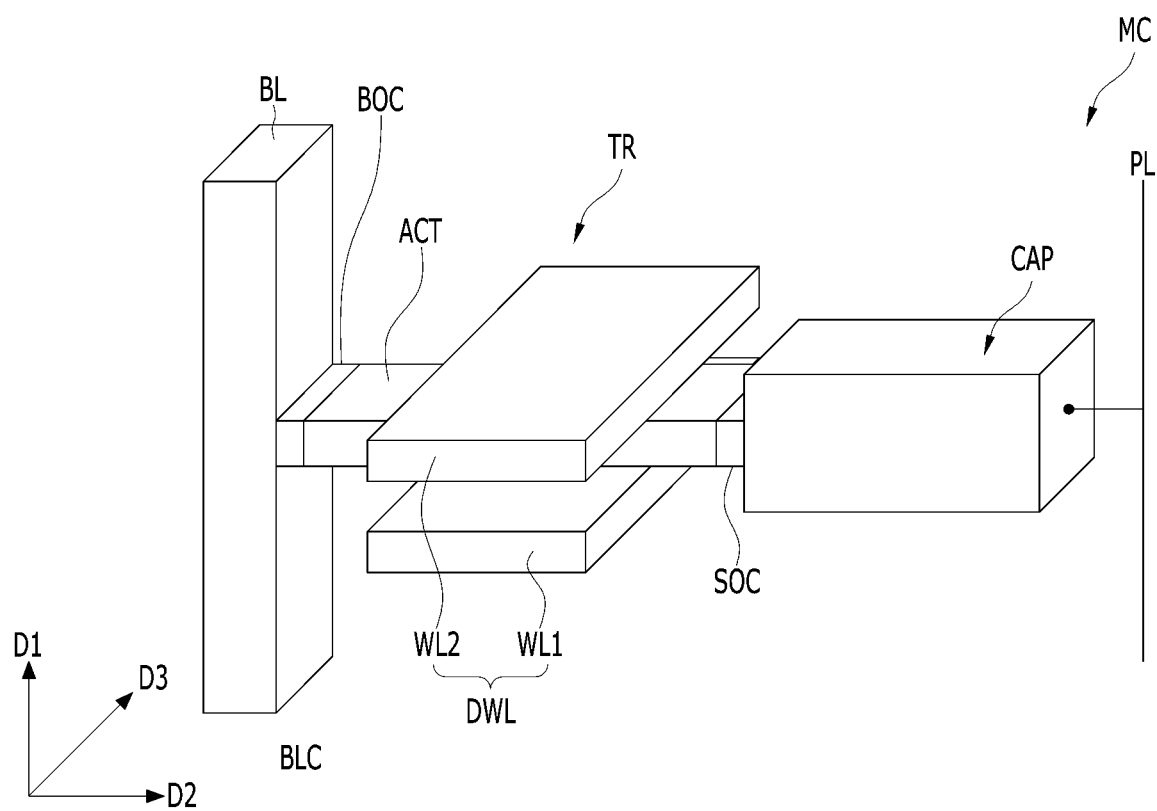
FIG. 13 is a perspective view illustrating a memory cell of a semiconductor memory device in accordance with embodiments of the present invention.
Figure 14:
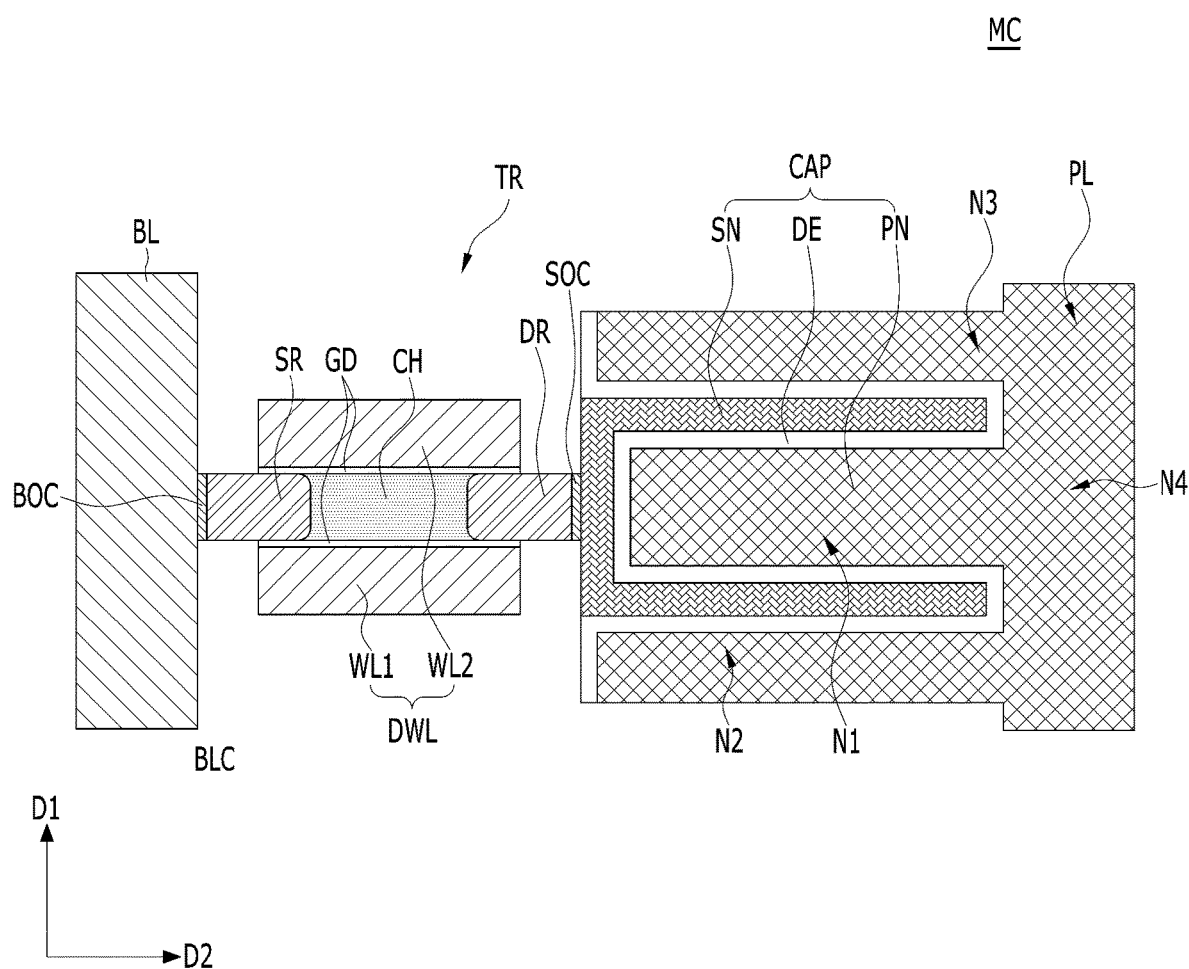
FIG. 14 is a cross-sectional view illustrating the memory cell shown in FIG. 13.

FIG. 13 is a perspective view illustrating a unit memory cell of a semiconductor memory device in accordance with embodiments of the present invention. FIG. 14 is a cross-sectional view illustrating the memory cell shown in FIG. 13.

Referring to FIGS. 13 and 14, the unit memory cell MC of the 3D semiconductor memory device in accordance with the embodiments of the present invention may include a bit line BL, a transistor TR, and a capacitor CAP. The transistor TR may include an active layer ACT, a gate dielectric layer GD, and a double word line DWL. The capacitor CAP may include a storage node SN, a dielectric layer DE, and a plate node PN. The bit line BL may have a pillar shape extending in the first direction D1. The active layer ACT may have a bar shape extending long in the second direction D2 that intersects with the first direction D1. The double word line DWL may have a line shape extending in the third direction D3 that intersects with the first direction D1 and the second direction D2. The plate node PN of the capacitor CAP may be coupled to a plate line PL.

The bit line BL may be vertically oriented in the first direction D1. The bit line BL may be referred to as a vertically oriented bit line or a pillar-type bit line. The bit line BL may include a conductive material. The bit line BL may include a silicon-based material, a metal-based material, or a combination thereof. The bit line BL may include polysilicon, a metal, a metal nitride, a metal silicide, or a combination thereof. The bit line BL may include polysilicon, titanium nitride, tungsten, or a combination thereof. For example, the bit line BL may include polysilicon or titanium nitride (TiN) doped with an N-type impurity. The bit line BL may include a stack (TiN/W) of titanium nitride and tungsten.

The transistor TR may include an active layer ACT, a gate dielectric layer GD, and a double word line DWL. The double word line DWL may extend in the third direction D3, and the active layer ACT may extend in the second direction D2. The active layer ACT may be laterally arranged from the bit line BL. The double word line DWL may include a first word line WL1 and a second word line WL2. The first word line WL1 and the second word line WL2 may face each other with the active layer ACT interposed therebetween. The gate dielectric layer GD may be formed over the upper and lower surfaces of the active layer ACT.

The active layer ACT may include a semiconductor material or an oxide semiconductor. For example, the active layer ACT may include silicon, germanium, silicon-germanium, or indium gallium zinc oxide (IGZO). The active layer ACT may include a thin-body channel CH, a first source/drain region SR between the thin-body channel CH and the bit line BL, and a second source/drain region DR between the thin-body channel CH and the capacitor CAP.

The first source/drain region SR and the second source/drain region DR may be doped with impurities of the same conductivity type. The first source/drain region SR and the second source/drain region DR may be doped with an N-type impurity or a P-type impurity. The first source/drain region SR and the second source/drain region DR may include at least one impurity selected among arsenic (As), phosphorus (P), boron (B), indium (In), and combinations thereof. A first side of the first source/drain region SR may contact the bit line BL, and a second side of the first source/drain region SR may contact the thin-body channel CH. A first side of the second source/drain region DR may contact the storage node SN, and a second side of the second source/drain region DR may contact the thin-body channel CH. The second side of the first source/drain region SR and the second side surface of the second source/drain region DR may partially overlap with the sides of the first and second word lines WL1 and WL2, respectively. The lateral length of the thin-body channel CH in the second direction D2 may be smaller than the lateral lengths of the first and second source/drain regions SR and DR in the second direction D2. According to another embodiment of the present invention, the lateral length of the thin-body channel CH in the second direction D2 may be greater than the lateral lengths of the first and second source/drain regions SR and DR in the second direction D2.

The transistor TR may be a cell transistor and may have a double word line DWL. In the double word line DWL, the first word line WL1 and the second word line WL2 may have the same potential. For example, the first word line WL1 and the second word line WL2 may form a pair to be coupled to one memory cell MC. The same word line driving voltage may be applied to the first word line WL1 and the second word line WL2. As such, the memory cell MC according to the embodiment of the present invention may have a double word line DWL in which a first word line WL1 and a second word line WL2 are adjacent to one thin-body channel CH.

The active layer ACT may have a thickness which is smaller than those of the first word line WL1 and the second word line WL2. In other words, a vertical thickness of the active layer ACT in the first direction D1 may be smaller than a vertical thickness of each of the first word line WL1 and the second word line WL2 in the first direction D1. For this reason, the thin active layer ACT may be referred to as a thin-body active layer. The thin active layer ACT may include the thin-body channel CH, and the thin-body channel CH may have a thickness of approximately 10 nm or less. According to another embodiment of the present invention, the thin-body channel CH may have the same vertical thickness as the first and second word lines WL1 and WL2.

The upper and lower surfaces of the active layer ACT may have a flat surface. In other words, the upper surface and the lower surface of the active layer ACT may be parallel to each other in the second direction D2.

The gate dielectric layer GD may include silicon oxide, silicon nitride, a metal oxide, a metal oxynitride, a metal silicate, a high-k material, a ferroelectric material, an anti-ferroelectric material, or a combination thereof. The gate dielectric layer GD may include $SiO_2$, $Si_3N_4$, $HfO_2$, $Al_2O_3$, $ZrO_2$, AlON, HfON, HfSiO, HfSiON, or a combination thereof.

Each of the first word line WL1 and the second word line WL2 of the double word line DWL may include a metal, a metal mixture, a metal alloy, or a semiconductor material. The double word line DWL may include titanium nitride, tungsten, polysilicon, or a combination thereof. For example, the double word line DWL may include a TiN/W stack in which titanium nitride and tungsten are sequentially stacked. The double word line DWL may include an N-type work function material or a P-type work function material. The N-type work function material may have a low work function of approximately 4.5 eV or less, and the P-type work function material may have a high work function of approximately 4.5 eV or more.

According to the embodiment of the present invention, in the double word line DWL, a first word line WL1 and a second word line WL2 may form a pair with the active layer ACT interposed therebetween. The double word line DWL may be coupled to one memory cell MC.

A bit line side-ohmic contact BOC may be formed between the first source/drain region SR and the bit line BL. The bit line side-ohmic contact BOC may have a height that fully covers the first side of the first source/drain region SR. The bit line-side-ohmic contact BOC may be formed by deposition of a metal layer and annealing. For example, the bit line-side-ohmic contact BOC may be formed as the metal of the metal layer reacts with the silicon of the first source/drain region SR. The bit line side-ohmic contact BOC may include a metal silicide. The bit line side-ohmic contact BOC may include titanium silicide, cobalt silicide, nickel silicide, or the like.

The capacitor CAP may be disposed laterally in the second direction D2 from the transistor TR. The capacitor CAP may include a storage node SN extending laterally from the active layer ACT in the second direction D2. The capacitor CAP may further include a dielectric layer DE and a plate node PN over the storage node SN. The storage node SN, the dielectric layer DE, and the plate node PN may be arranged laterally in the second direction D2. The storage node SN may have a laterally oriented cylinder shape. The dielectric layer DE may conformally cover the cylinder inner wall and the cylinder outer wall of the storage node SN. The plate node PN may have a shape extending to a cylinder inner wall and a cylinder outer wall of the storage node SN over the dielectric layer DE. The plate node PN may be coupled to the plate line PL. The storage node SN may be electrically connected to the second source/drain region DR.

The storage node SN may have a three-dimensional structure, and the three-dimensional storage node SN may have a lateral three-dimensional structure oriented in the second direction D2. As an example of the three-dimensional structure, the storage node SN may have a cylinder shape. According to another embodiment of the present invention, the storage node SN may have a pillar shape or a pylinder shape. The pylinder shape may refer to a structure in which a pillar shape and a cylinder shape are merged. The uppermost surface of the storage node SN may be positioned at the same level as the uppermost surface of the first word line WL1. The lowermost surface of the storage node SN may be positioned at the same level as the lowermost surface of the second word line WL2.

The plate node PN may include an internal node N1 and external nodes N2, N3, and N4. The internal node N1 and the external nodes N2, N3, and N4 may be interconnected to each other. The internal node N1 may be positioned inside the cylinder of the storage node SN. The external nodes N2 and N3 may be positioned outside the cylinder of the storage node SN with the dielectric layer DE interposed therebetween. The external node N4 may interconnect the internal node N1 and the external nodes N2 and N3 to each other.

The external nodes N2 and N3 may be positioned to surround the outer wall of the cylinder of the storage node SN. The external node N4 may serve as a plate line PL.

The storage node SN and the plate node PN may include a metal, a noble metal, a metal nitride, a conductive metal oxide, a conductive noble metal oxide, a metal carbide, a metal silicide, or a combination thereof. For example, the storage node SN and the plate node PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, and a tungsten nitride/tungsten (WN/W) stack. The plate node PN may include a combination of a metal-based material and a silicon-based material. For example, the plate node PN may be a stack of titanium nitride/silicon germanium/tungsten nitride (TiN/SiGe/WN). In the titanium nitride/silicon germanium/tungsten nitride (TiN/SiGe/WN) stack, silicon germanium may be a gap-fill material that fills the inside of the cylinder of the storage node SN, and titanium nitride (TiN) may serve as a plate node (PN) of the capacitor CAP, and tungsten nitride may be a low-resistance material.

The dielectric layer DE may include silicon oxide, silicon nitride, a high-k material, or a combination thereof. The high-k material may have a higher dielectric constant than silicon oxide. Silicon oxide ($SiO_2$) may have a dielectric constant of approximately 3.9, and the dielectric layer DE may include a high-k material having a dielectric constant of approximately 4 or more. The high-k material may have a dielectric constant of approximately 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) or strontium titanium oxide ($SrTiO_3$). According to another embodiment of the present invention, the dielectric layer DE may be formed of a composite layer including two or more layers of the aforementioned high-k materials.

The dielectric layer DE may be formed of zirconium-based oxide. The dielectric layer DE may have a stack structure including zirconium oxide ($ZrO_2$). The stack structure including zirconium oxide ($ZrO_2$) may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked over zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as a zirconium oxide-based layer ($ZrO_2$-based layer). According to another embodiment of the present invention, the dielectric layer DE may be formed of hafnium-based oxide (Hf-based oxide). The dielectric layer DE may have a stack structure including hafnium oxide ($HfO_2$). The stack structure including hafnium oxide ($HfO_2$) may include an HA (HfO$_2$/Al$_2$O$_3$) stack or an HAH (HfO$_2$/Al$_2$O$_3$/HfO$_2$) stack. The HA stack may have a structure in which aluminum oxide (Al$_2$O$_3$) is stacked over hafnium oxide (HfO$_2$). The HAH stack may have a structure in which hafnium oxide (HfO$_2$), aluminum oxide (Al$_2$O$_3$), and hafnium oxide (HfO$_2$) are sequentially stacked. The HA stack and the HAH stack may be referred to as a hafnium oxide-based layer (HfO$_2$-based layer). In the ZA stack, ZAZ stack, HA stack, and HAH stack, aluminum oxide (Al$_2$O$_3$) may have a larger band gap than zirconium oxide (ZrO$_2$) and hafnium oxide (HfO$_2$). Aluminum oxide (Al$_2$O$_3$) may have a lower dielectric constant than zirconium oxide (ZrO$_2$) and hafnium oxide (HfO$_2$). Accordingly, the dielectric layer DE may include a stack of a high-k material and a high-bandgap material having a larger band gap than that of the high-k material. The dielectric layer DE may include silicon oxide (SiO$_2$) as a high bandgap material other than aluminum oxide (Al$_2$O$_3$). Since the dielectric layer DE includes a high bandgap material, leakage current may be suppressed. The high bandgap material may be thinner than the high-k material. According to another embodiment of the present invention, the dielectric layer DE may include a laminated structure in which a high-k material and a high-bandgap material are alternately stacked. For example, the dielectric layer DE may include ZAZA (ZrO$_2$/Al$_2$O$_3$/ZrO$_2$/Al$_2$O$_3$), ZAZAZ (ZrO$_2$/Al$_2$O$_3$/ZrO$_2$/Al$_2$O$_3$/ZrO$_2$), HAHA (HfO$_2$/Al$_2$O$_3$/HfO$_2$/Al$_2$O$_3$) or HAHAH (HfO$_2$/Al$_2$O$_3$/HfO$_2$/Al$_2$O$_3$/HfO$_2$). In the above laminated structure, aluminum oxide (Al$_2$O$_3$) may be thinner than zirconium oxide and hafnium oxide.

According to another embodiment of the present invention, the dielectric layer DE may include a stack structure, a laminated structure, or a mixed structure including zirconium oxide, hafnium oxide, and aluminum oxide.

According to another embodiment of the present invention, an interface control layer (not shown) for improving leakage current may be further formed between the storage node SN and the dielectric layer DE. The interface control layer may include titanium oxide (TiO$_2$). The interface control layer may also be formed between the plate node PN and the dielectric layer DE.

The capacitor CAP may include a MIM (metal-insulator-metal) capacitor. The storage node SN and the plate node PN may include a metal-based material.

The capacitor CAP may be replaced with another data storage material. For example, the data storage material may be a phase-change material, a magnetic tunnel junction (MTJ), or a variable resistance material.

A storage node side-ohmic contact SOC may be formed between the second source/drain region DR and the storage node SN. The storage node side-ohmic contact SOC may have a height that fully covers the first side of the second source/drain region DR. The storage node side-ohmic contact SOC may be formed by deposition of a metal layer and annealing. For example, the storage node side-ohmic contact SOC may be formed as the metal of the metal layer reacts with silicon of the second source/drain region DR. The storage node side-ohmic contact SOC may include a metal silicide. The storage node side-ohmic contact SOC may include titanium silicide, cobalt silicide, nickel silicide, or the like.

Figure 15:
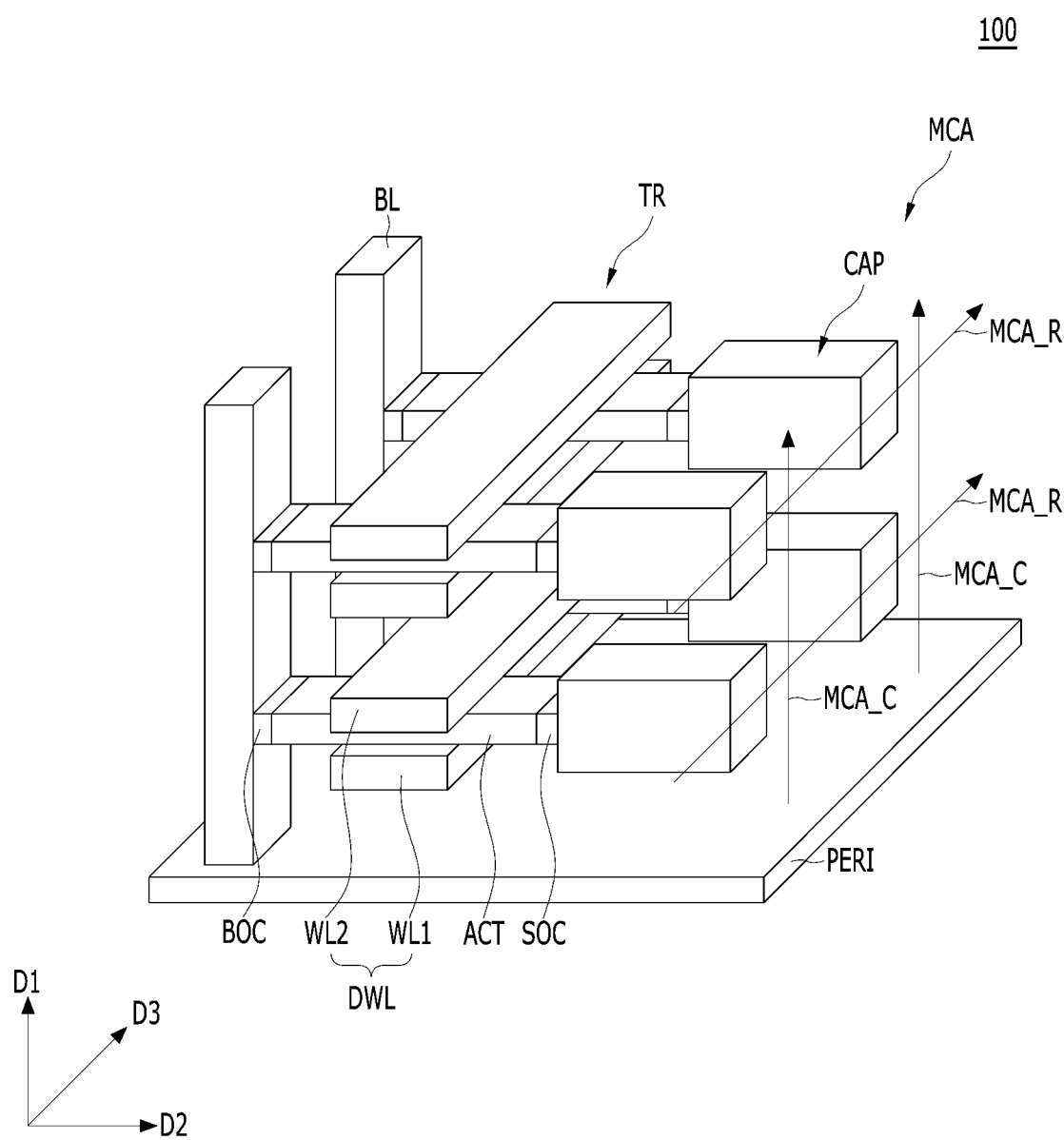
FIG. 15 is a perspective view illustrating a semiconductor memory device in accordance with an embodiment of the present invention.
Figure 16:
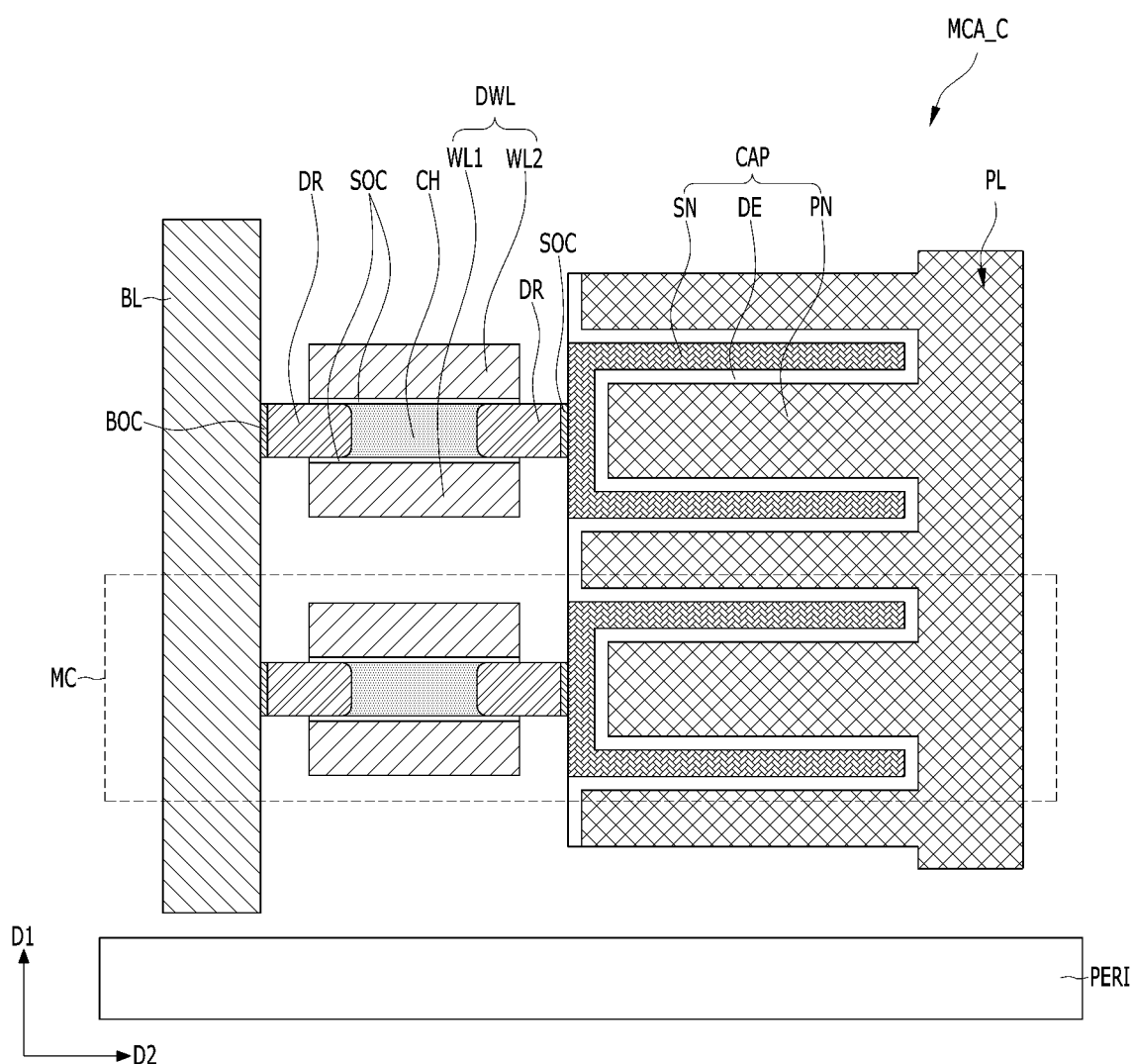
FIG. 16 is a cross-sectional view illustrating the vertical memory cell array MCA-C shown in FIG. 3.

FIG. 15 is a perspective view illustrating a semiconductor memory device in accordance with an embodiment of the present invention. FIG. 16 is a cross-sectional view illustrating the vertical memory cell array MCA_C shown in FIG. 15.

Referring to FIGS. 15 and 16, the semiconductor memory device 100 may include a memory cell array MCA. The memory cells MC of FIG. 14 may be arranged in the first to third directions D1, D2, and D3 to form a multi-layered memory cell array MCA. The memory cell array MCA may include a three-dimensional array of memory cells MC, and the three-dimensional memory cell array may include a vertical memory cell array MCA_C and a lateral memory cell array MCA_R. The vertical memory cell array MCA_C may refer to an array of memory cells MC that are vertically arranged in the first direction D1. The lateral memory cell array MCA_R may refer to an array of memory cells MC that are laterally arranged in the third direction D3. The vertical memory cell array MCA_C may be referred to as a column array of memory cells MC, and the lateral memory cell array MCA_R may be referred to as a row array of memory cells MC. The bit line BL may be vertically oriented in the first direction D1 to be coupled to the vertical memory cell array MCA_C, and the double word line DWL may be laterally oriented in the third direction D3 to be coupled to the lateral memory cell array MCA_R. The bit line BL coupled to the vertical memory cell array MCA_C may be referred to as a common bit line, and the vertical memory cell arrays MCA_C that are adjacent to each other in the third direction D3 may be coupled to different common bit lines. The double word line DWL coupled to the lateral memory cell array MCA_R may be referred to as a common double word line DWL, and the lateral memory cell arrays MCA_R that are adjacent to each other in the first direction D1 may be coupled to different common double word lines DWL.

The memory cell array MCA may include a plurality of memory cells MC, and each memory cell MC may include a vertically oriented bit line BL, a laterally oriented active layer ACT, a double word line DWL, and a laterally oriented capacitor CAP. FIG. 15 illustrates a three-dimensional memory cell array including four memory cells MC.

The active layers ACT that are adjacent to each other in the first direction D1 may contact one bit line BL. The active layers ACT that are adjacent to each other in the third direction D3 may share the double word line DWL. The capacitors CAP may be coupled to the active layers ACT, respectively. The capacitors CAP may share one plate line PL. The individual active layers ACT may be thinner than the first and second word lines WL1 and WL2 of the double word line DWL.

In the memory cell array MCA, the double word lines DWL may be vertically stacked in the first direction D1. Each double word line DWL may include a pair of a first word line WL1 and a second word line WL2. Between the first word line WL1 and the second word line WL2, a plurality of active layers ACT may be laterally arranged to be spaced apart from each other in the second direction D3. The thin-body channel CH of the active layer ACT may be positioned between the first word line WL1 and the second word line WL2.

The semiconductor memory device 100 may further include a substrate PERI, and the substrate PERI may include a peripheral circuit unit. Hereinafter, the substrate PERI will be simply referred to as a peripheral circuit unit PERI. The bit line BL of the memory cell array MCA may be vertically oriented in the first direction D1 with respect to the surface (upper surface or lower surface) of the peripheral circuit unit PERI, and the double word line DWL may be oriented in the third direction D3 while being parallel to the surface of the peripheral circuit unit PERI.

The bit line BL and the capacitor CAP of FIGS. 13 to 16 may be formed by the methods described in the following embodiments of the present invention.

FIGS. 17 to 23 are cross-sectional views illustrating a method for fabricating a semiconductor memory device in accordance with an embodiment of the present invention. FIGS. 17 to 23 may be performed after the second vertical isolation portions 26V, the lower-level insulating pads 26, and the lower-level insulating plugs 26P are formed according to FIGS. 2 to 9.

Figure 17:
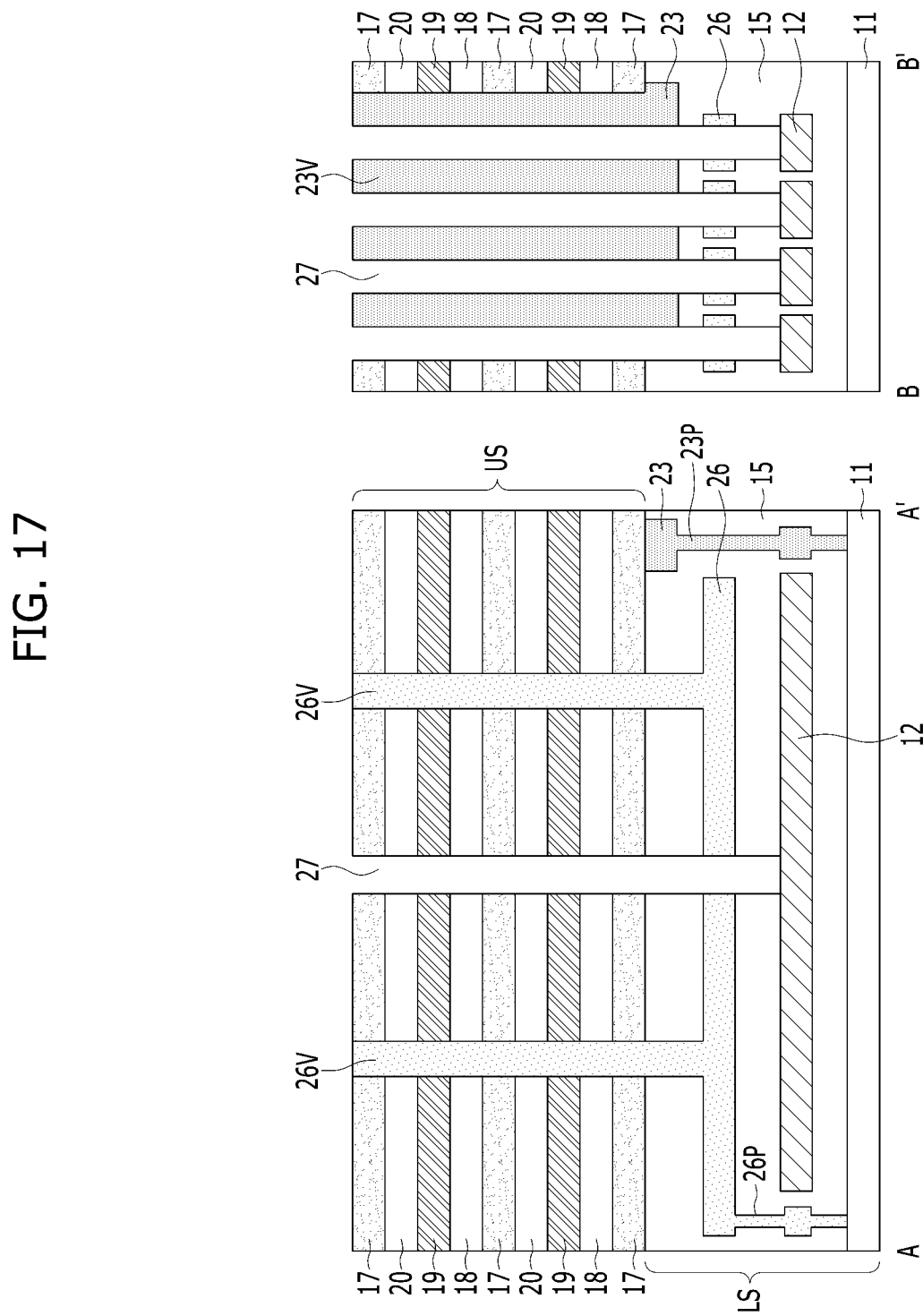
FIGS. 17 to 23 are cross-sectional views illustrating a method for fabricating a semiconductor memory device in accordance with an embodiment of the present invention.

Referring to FIG. 17, a portion of the second vertical isolation portions 26V may be etched to form third openings 27. Subsequently, the inter-layer dielectric layer 15 and the lower-level insulating pads 26 may be etched to expose the metal pad 12. The third openings 27 may extend perpendicular to the surface of the metal pad 12. From the perspective of a top view, the third openings 27 may have a rectangular, tower-type or circular shape. The third openings 27 may penetrate the lower-level insulating pads 26.

Figure 18:
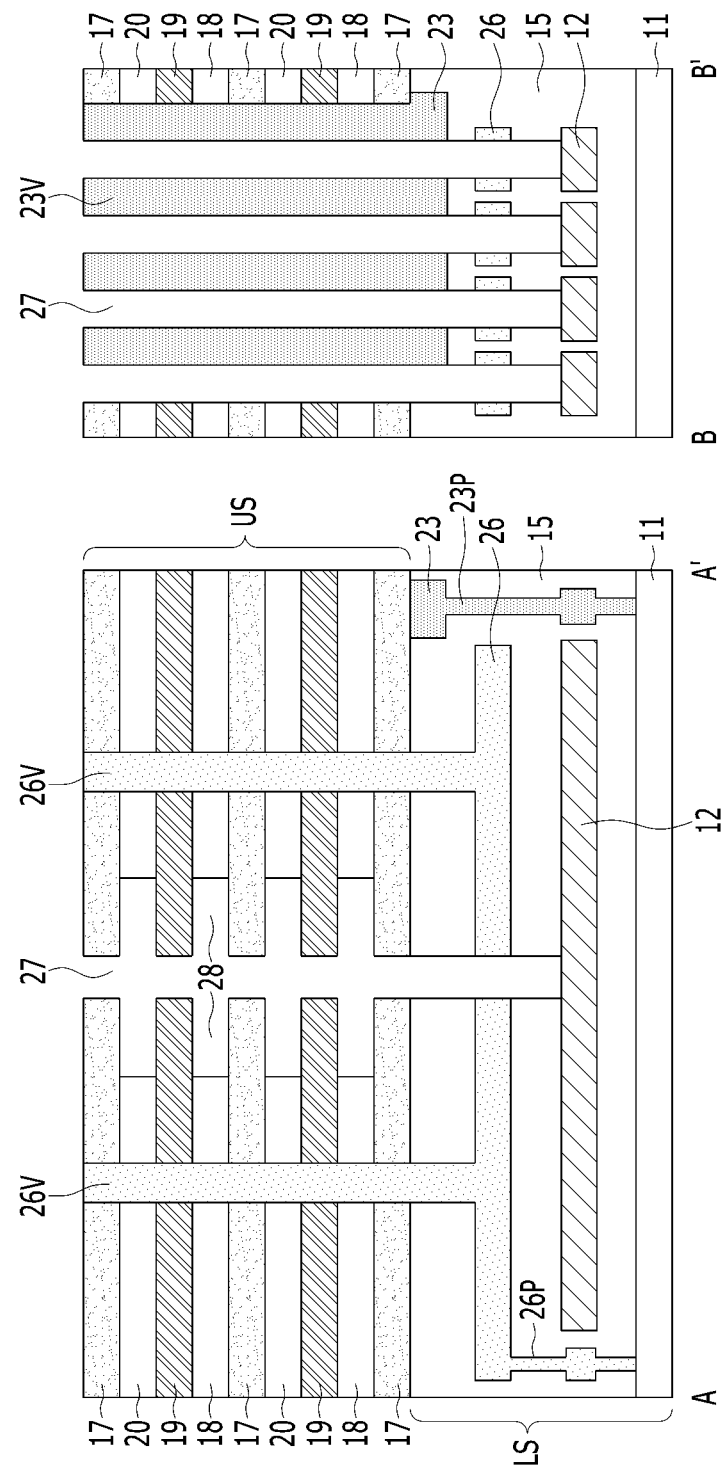

Referring to FIG. 18, a plurality of lateral recesses 28 extending laterally from the third openings 27 may be formed. The lateral recesses 28 may be formed by etching the second dielectric layers 18 and the third dielectric layers 20. The second dielectric layers 18 and the third dielectric layers 20 may be exposed to wet etching to form the lateral recesses 28.

Figure 19:
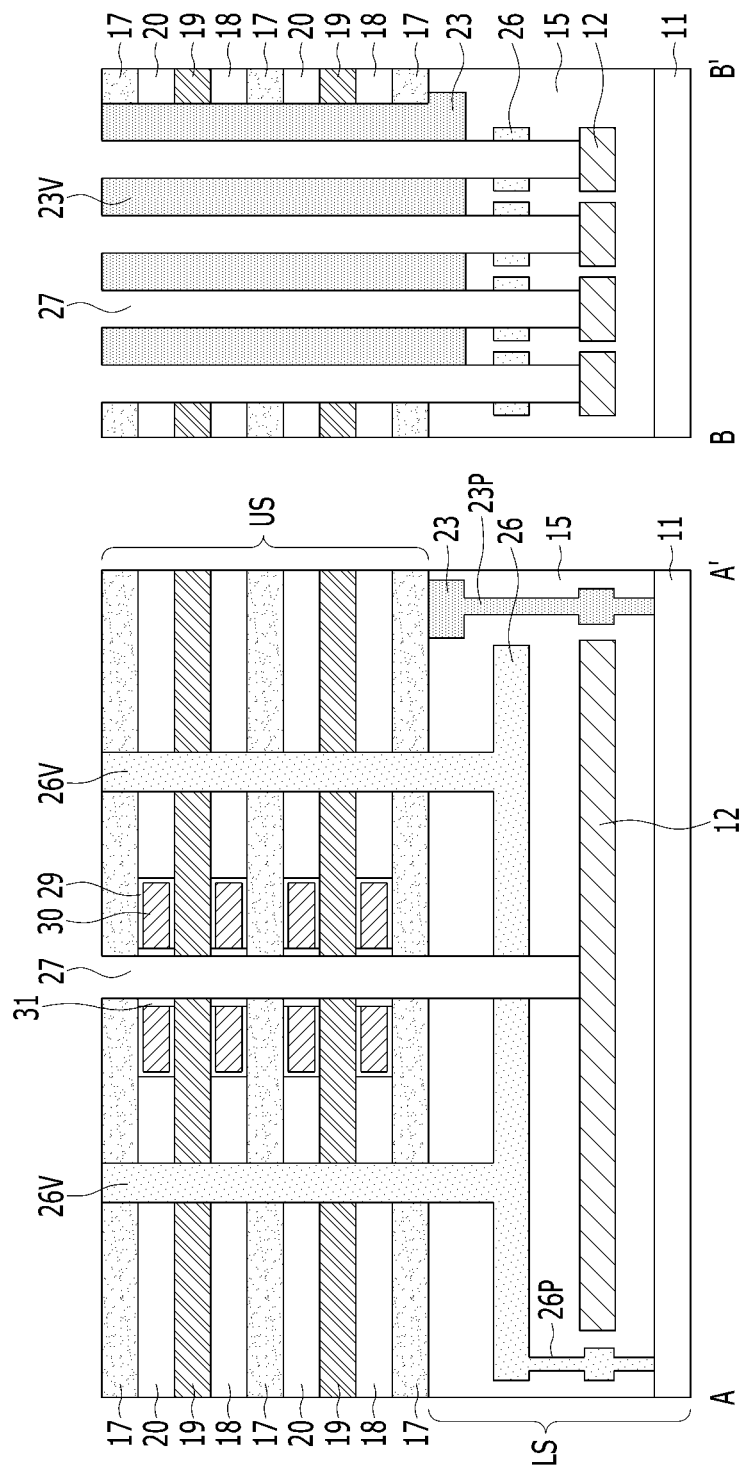

Referring to FIG. 19, word line structures may be respectively formed in the lateral recesses 28. Each of the word line structures may include a gate dielectric layer 29 and a word line 30. A pair of laterally oriented word lines 30 may face each other with the semiconductor layer 19 interposed therebetween. The pair of the laterally oriented word lines 30 may correspond to the double word lines of the above-described embodiments.

After the word line structures are formed, the bit line side capping layer 31 may be formed. The bit line side capping layer 31 may include silicon oxide. The bit line side capping layer 31 may not fill the third openings 27.

Figure 20:
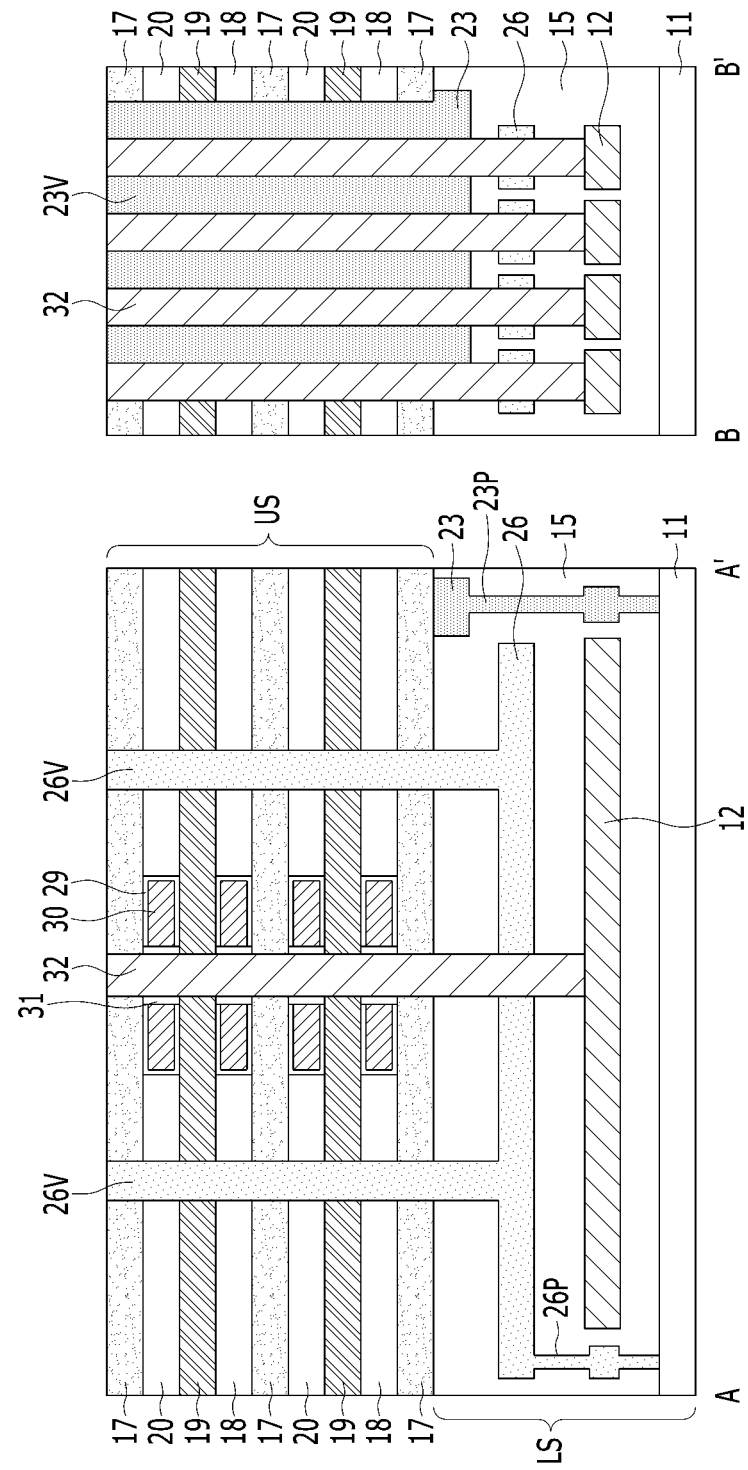

Referring to FIG. 20, vertically oriented bit lines 32 filling the third openings 27 may be formed. The vertically oriented bit lines 32 may be coupled to the metal pad 12.

Figure 21:
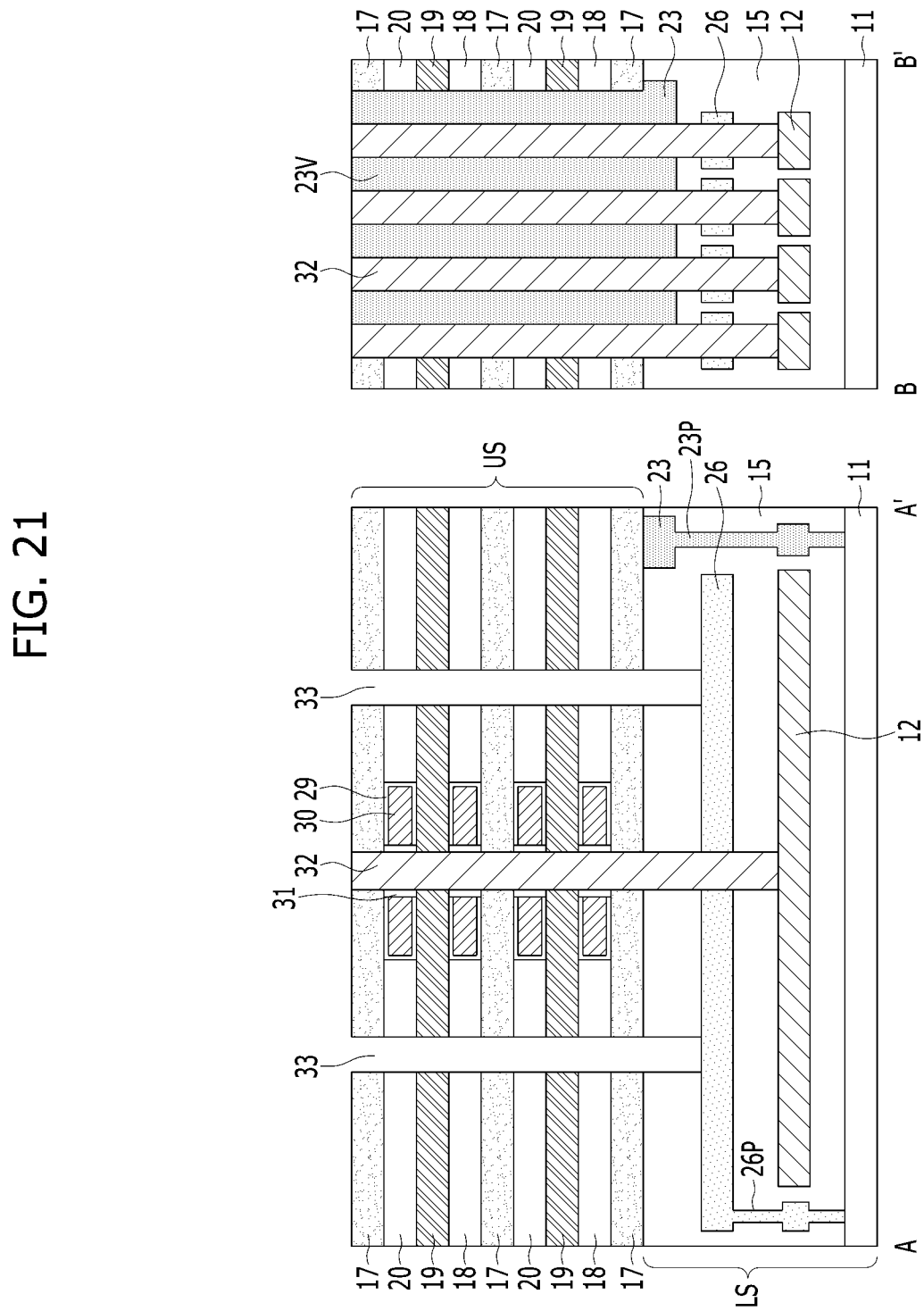

Referring to FIG. 21, fourth openings 33 may be formed by etching the second vertical isolation portions 26V. The fourth openings 33 may not penetrate the lower-level insulating pads 26. The fourth openings 33 may contact the surface of the lower-level insulating pads 26 and may extend perpendicular to the surface of the lower-level insulating pads 26. From the perspective of a top view, the fourth openings 33 may have a rectangular, tower-type or circular shape.

Figure 22:
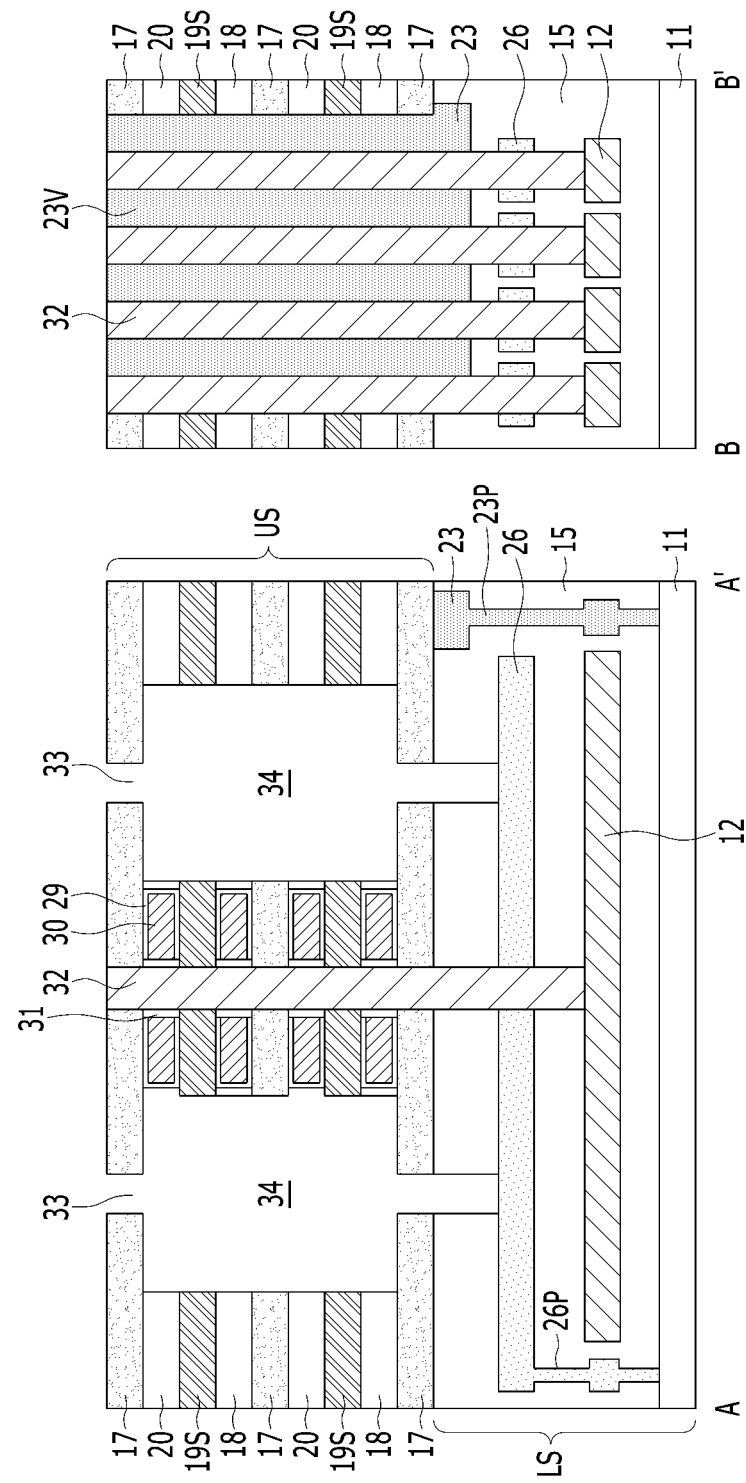

Referring to FIG. 22, a plurality of second lateral recesses 34 extending laterally from the fourth openings 33 may be formed. The third lateral recesses 34 may be formed by etching the second dielectric layers 18, the third dielectric layers 20, and the semiconductor layers 19. The second lateral recesses 34 may be positioned between the first dielectric layers 17 in a direction perpendicular to the lower-level insulating pads 26. Laterally oriented active layers 19S may be formed by etching the semiconductor layers 19.

Figure 23:
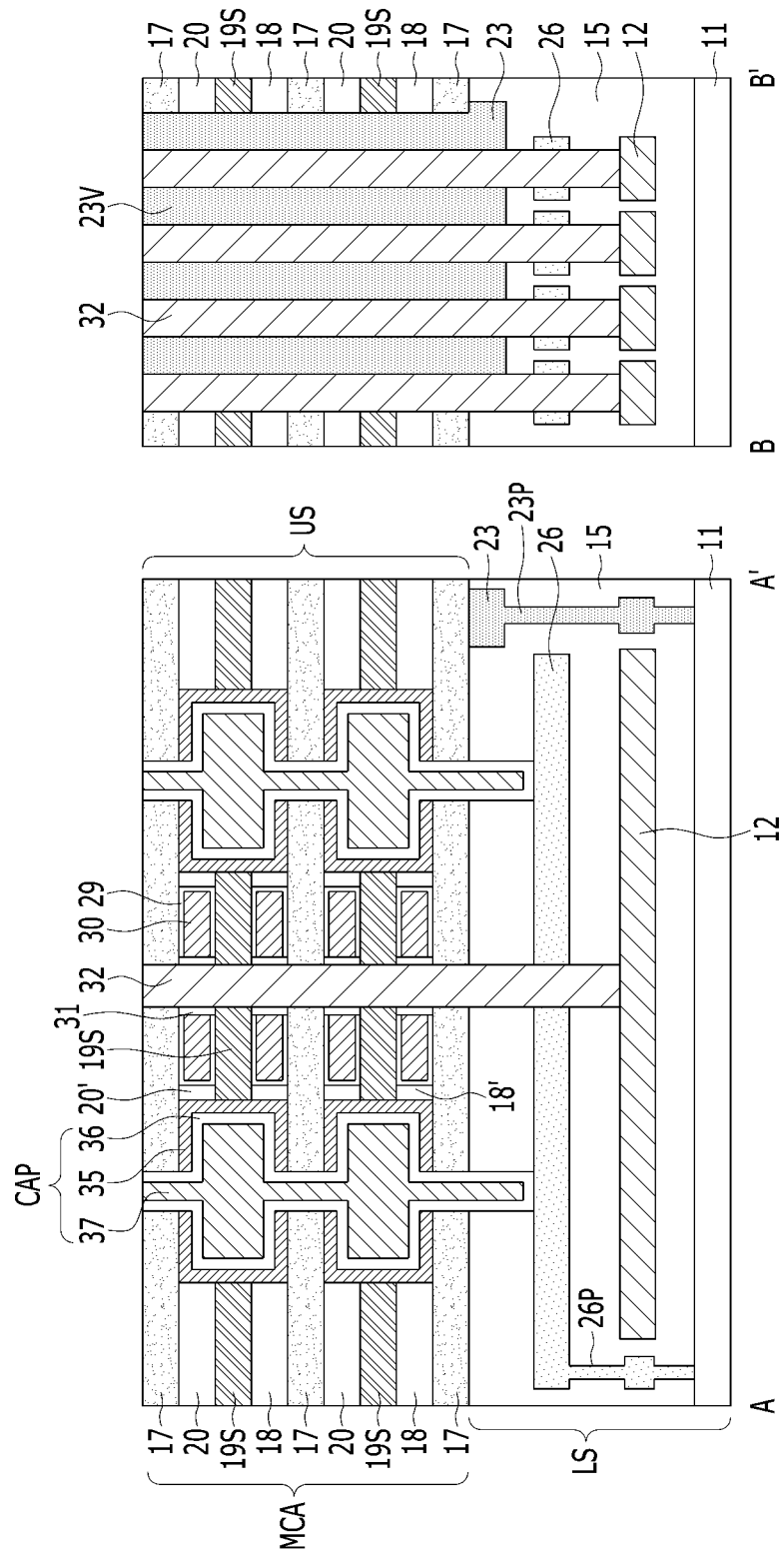

Referring to FIG. 23, a capacitor CAP may be formed. Storage nodes 35 may be respectively formed in the second lateral recesses 34. The storage nodes 35 may have a cylindrical shape. The storage nodes 35 may be spaced apart from each other. First ends of the active layers 19S may be commonly coupled to the bit line 32, and second ends of the active layers 19S may be coupled to the storage nodes 35, respectively. Storage node-side capping layers 18' and 20' may be formed over the upper/lower surfaces of the edges of the laterally oriented active layers 19S. The storage node-side capping layers 18' and 20' may be formed by etching the second dielectric layers 18 and the third dielectric layers 20, as shown in FIG. 22.

A dielectric layer 36 may be formed over the storage nodes 35, and a plate node 37 may be formed over the dielectric layer 36. The plate node 37 may fill the fourth openings 33 and may extend perpendicular to the lower-level insulating pads 26. Portions of the plate node 37 may extend laterally to be located in the second lateral recesses 34.

The memory cell array MCA may be formed over the lower structure LS by a series of processes illustrated in FIGS. 17 to 23. The semiconductor device may include the metal pad 12 over the substrate 11, the lower-level insulating pad 26 over the metal pad 12, the upper-level insulating pads 23 positioned at a higher level than the lower-level insulating pad 26, and the memory cell array MCA positioned at a higher level than the upper-level insulating pads 23. The lower-level insulating pad 26 may be referred to as 'a first lateral insulating pad'. The upper-level insulating pads 23 may be referred to as 'second lateral insulating pads'.

The memory cell array MCA may include a plurality of the first dielectric layers 17 that are stacked in a direction perpendicular to the surface of the substrate 11, a plurality of the laterally oriented active layers 19S that are positioned between the first dielectric layers 17, the laterally oriented word lines 30 that are positioned between the laterally oriented active layers 19S and the first dielectric layers 17, the vertically oriented bit line 32 that is coupled to one-side ends of the laterally oriented active layers 19S, and capacitors CAP including the storage nodes 35 that are coupled to the another-side ends of the laterally oriented active layers 19S. The memory cell array MCA may have a mirror-like structure that shares the bit line 32.

The first dielectric layers 17 may be referred to as 'lateral isolation layers'. First vertical isolation portions 23V may be positioned between the vertically oriented bit lines 32. The vertically oriented bit lines 32 may be coupled to the metal pad 12 and penetrate the lower-level insulating pads 26.

According to the embodiment of the present invention, since an etch stopper pad of a metal-based material is formed below an etch target layer, it is possible to prevent arcing that may occur during an etch process of the etch target layer, thereby improving the reliability of the semiconductor device.

According to the embodiment of the present invention, since an etch stopper pad of a metal-based material is formed below the etch target layer, charges induced during a plasma etching process of the etch target layer may be discharged to the substrate.

The effects desired to be obtained in the embodiments of the present invention are not limited to the effects mentioned above, and other effects not mentioned above may also be clearly understood by those of ordinary skill in the art to which the present invention pertains from the description below.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
   forming an etch stopper pad including a sacrificial plug over a substrate and a sacrificial pad over the sacrificial plug;
   forming an etch target layer over the etch stopper pad;
   forming a plurality of openings by etching the etch target layer and stopping the etching at the sacrificial pad;
   forming an air gap by removing the sacrificial pad and the sacrificial plug through the openings; and
   forming a gap-fill layer that fills the openings and the air gap.

2. The method of claim 1, wherein the sacrificial pad has a bended shape.

3. The method of claim 1, wherein the forming of the gap-fill layer includes:
   forming a dielectric material to fill the openings and the air gap, and
   wherein the dielectric material includes a lateral portion that fills the air gap and vertical portions that fills the openings.

4. The method of claim 3, wherein the lateral portion of the dielectric material has a line shape extending in one direction, and
   the vertical portions of the dielectric material have a pillar shape extending vertically from the lateral portion.

5. The method of claim 1, wherein the sacrificial plug and the sacrificial pad include a material having an etch selectivity with respect to the etch target layer.

6. The method of claim 1, wherein the sacrificial plug and the sacrificial pad include a metal-based material.

7. The method of claim 1, wherein the etch target layer includes an alternating stack in which different materials are alternately stacked, and
   the etch stopper pad has an etch selectivity with respect to the alternating stack.

8. The method of claim 1, wherein the etch target layer includes a dielectric layer, a semiconductor layer, or a combination thereof.

9. The method of claim 1, wherein the etch target layer includes an alternating stack in which dielectric layers and semiconductor layers are alternately stacked.

10. The method of claim 1,
    wherein the etch target layer includes at least one stack layer in which a first dielectric layer, a second dielectric layer, a semiconductor layer, and a third dielectric layer are stacked in a mentioned order,
    wherein the first dielectric layer includes silicon oxide,
    wherein the second and third dielectric layers include silicon nitride, and
    wherein the semiconductor layer includes polysilicon.

11. The method of claim 1,
    wherein the etch target layer includes an alternating stack in which first semiconductor layers and second semiconductor layers are alternately stacked,
    wherein the first semiconductor layers include monocrystalline silicon or polysilicon, and
    wherein the second semiconductor layers include silicon germanium.

12. The method of claim 1, wherein the forming of the etch stopper pad includes:
    forming a lower-level stopper pad including a first sacrificial plug over the substrate and a first sacrificial pad over the first sacrificial plug;
    forming an upper-level stopper pad including a second sacrificial plug which is spaced apart from the first sacrificial plug over the substrate;
    and forming a second sacrificial pad which is positioned over the second sacrificial plug and positioned at a higher level than the first sacrificial pad.

13. The method of claim 12, wherein each of the first sacrificial plug, the first sacrificial pad, the second sacrificial plug, and the second sacrificial pad includes a metal-based material.

14. The method of claim 12, wherein each of the first sacrificial pad and the second sacrificial pad is formed by stacking tungsten and titanium nitride in a mentioned order.

15. The method of claim 12, wherein at least one among the first sacrificial pad and the second sacrificial pad has a dog-bone shape.

16. A semiconductor device, comprising:
    a metal pad over a substrate;
    a first lateral insulating pad over the metal pad;
    a second lateral insulating pad positioned at a higher level than the first lateral insulating pad; and
    a memory cell array positioned at a higher level than the second lateral insulating pad,
    wherein the memory cell array comprises a structure extending through the first or second lateral insulating pad to be coupled to the metal pad.

17. The semiconductor device of claim 16, wherein the structure includes a plurality of vertically oriented bit lines, and
    the vertically oriented bit lines extend through the first lateral insulating pad to be coupled to the metal pad.

18. The semiconductor device of claim 17, further comprising:
    a plurality of vertical isolation portions extending vertically from the second lateral insulating pad to support the vertically oriented bit lines.

19. The semiconductor device of claim 16, further comprising:
    a first insulating plug extending from the first lateral insulating pad and positioned between the first lateral insulating pad and the substrate; and
    a second insulating plug extending from the second lateral insulating pad and positioned between the second lateral insulating pad and the substrate.

20. The semiconductor device of claim 16, wherein the memory cell array includes:
    a plurality of lateral isolation layers that are stacked in a direction perpendicular to a surface of the substrate;
    a plurality of laterally oriented active layers that are positioned between the lateral isolation layers;
    laterally oriented word lines that are positioned between the laterally oriented active layers and the lateral isolation layers;
    a vertically oriented bit line that is coupled to one-side ends of the laterally oriented active layers; and
    capacitors including storage nodes that are coupled to another-side ends of the laterally oriented active layers.

* * * * *